United States Patent
Kostromine et al.

(10) Patent No.: US 11,059,930 B2
(45) Date of Patent: Jul. 13, 2021

(54) PROTECTIVE LAYER FOR PHOTOPOLYMER

(71) Applicant: Covestro Deutschland AG, Leverkusen (DE)

(72) Inventors: Serguei Kostromine, Swisttal-Buschhoven (DE); Thomas Roelle, Leverkusen (DE); Wieland Hovestadt, Leichlingen (DE); Karl Vetterle, Leverkusen (DE); Therese Klobutowski, Leverkusen (DE)

(73) Assignee: Covestro Deutschland AG, Leverkusen (DE)

( * ) Notice: Subject to any disclaimer, the term of this patent is extended or adjusted under 35 U.S.C. 154(b) by 0 days.

(21) Appl. No.: 16/634,199

(22) PCT Filed: Jul. 23, 2018

(86) PCT No.: PCT/EP2018/069888
§ 371 (c)(1),
(2) Date: Jan. 27, 2020

(87) PCT Pub. No.: WO2019/020553
PCT Pub. Date: Jan. 31, 2019

(65) Prior Publication Data
US 2021/0095064 A1  Apr. 1, 2021

(30) Foreign Application Priority Data
Jul. 26, 2017 (EP) .................................. 17183344

(51) Int. Cl.
| | | |
|---|---|---|
| *C08F 283/00* | (2006.01) | |
| *B29D 11/00* | (2006.01) | |
| *B32B 7/12* | (2006.01) | |
| *B32B 27/08* | (2006.01) | |
| *B32B 27/30* | (2006.01) | |
| *G03H 1/00* | (2006.01) | |
| *C09J 7/29* | (2018.01) | |
| *C08K 5/5415* | (2006.01) | |
| *G03H 1/02* | (2006.01) | |

(52) U.S. Cl.
CPC ...... *C08F 283/008* (2013.01); *B29D 11/0073* (2013.01); *B32B 7/12* (2013.01); *B32B 27/08* (2013.01); *B32B 27/306* (2013.01); *C08K 5/5415* (2013.01); *C09J 7/29* (2018.01); *G03H 1/0011* (2013.01); *G03H 1/0256* (2013.01); *G03H 2250/39* (2013.01); *G03H 2260/12* (2013.01)

(58) Field of Classification Search
CPC ... C08F 283/008; B29D 11/0073; B32B 7/12; B32B 27/08; B32B 27/306; G03H 1/0011; G03H 1/0256; G03H 2260/12; C09J 7/29; C08K 5/5415
See application file for complete search history.

(56) References Cited

U.S. PATENT DOCUMENTS

| | | | |
|---|---|---|---|
| 4,072,527 A * | 2/1978 | Fan | G03F 7/092 430/273.1 |
| 4,994,347 A | 2/1991 | Smothers | |
| 8,771,903 B2 | 7/2014 | Hönel et al. | |
| 8,889,322 B2 | 11/2014 | Weiser et al. | |
| 9,073,296 B2 | 7/2015 | Fäcke et al. | |
| 9,098,065 B2 | 8/2015 | Hönel et al. | |
| 9,146,456 B2 | 9/2015 | Berneth et al. | |
| 9,195,215 B2 | 11/2015 | Weiser et al. | |
| 9,804,490 B2 | 10/2017 | Rölle et al. | |
| 2018/0330753 A1 | 11/2018 | Fäcke et al. | |

FOREIGN PATENT DOCUMENTS

| | | |
|---|---|---|
| EP | 0223587 A1 | 5/1987 |
| EP | 0940720 A1 | 9/1999 |
| EP | 2613318 A1 | 7/2013 |
| WO | WO-2011054797 A1 | 5/2011 |
| WO | WO-2011067057 A1 | 6/2011 |
| WO | WO-20120062655 A2 | 5/2012 |
| WO | WO-20120062658 A1 | 5/2012 |
| WO | WO-2013079422 A1 | 6/2013 |
| WO | WO-2015091427 A1 | 6/2015 |
| WO | WO-2017081078 A1 | 5/2017 |

OTHER PUBLICATIONS

International Search Report for PCT/EP2018/069888 dated Nov. 29, 2018.
Written Opinion of the International Searching Authority for PCT/EP2018/069888 dated Nov. 29, 2018.

* cited by examiner

*Primary Examiner* — Michael C Miggins
(74) *Attorney, Agent, or Firm* — Faegre Drinker Biddle & Reath LLP

(57) ABSTRACT

The invention relates to a protective layer comprising a photopolymer layer B and an at least partly cured protective layer C, to a process for producing the layer construction according to the invention, to a kit of parts, to the use of an at least partly cured protective layer C for protection of a photopolymer layer B and to optical displays and security documents comprising the layer construction according to the invention.

17 Claims, No Drawings

PROTECTIVE LAYER FOR PHOTOPOLYMER

CROSS-REFERENCE TO RELATED APPLICATIONS

This application is a national stage application (under 35 U.S.C. § 371) of PCT/EP2018/069888, filed Jul. 23, 2018, which claims benefit of European Application No. 17183344.5, filed Jul. 26, 2017, both of which are incorporated herein by reference in their entirety.

The invention relates to a protective layer comprising a photopolymer layer B and an at least partly cured protective layer C, to a process for producing the layer construction according to the invention, to a kit of parts, to the use of an at least partly cured protective layer C for protection of a photopolymer layer B and to optical displays and security documents comprising the layer construction according to the invention.

Photopolymer layers for producing holographic media are known in principle, for example from WO 2011/054797 and WO 2011/067057. Advantages of these holographic media are their high light diffraction efficiency and simplified processing since after holographic irradiation no further chemical and/or thermal development steps are necessary.

The holographic film (Bayfol® HX from Covestro Deutschland AG) consists of a film substrate (A) and a light sensitive photopolymer layer (B). Optical holograms are formed in the layer (B) by local photopolymerization and fixed by areal UV-VIS irradiation. Thus layer (B) forms a no-longer-photosensitive, through-polymerized layer (B') comprising a previously inscribed hologram. While this hologram is per se very stable over time, its properties can change as a result of mechanical influences and/or on contact with for example organic substances (solvents). To reduce these external influences on the holographic-optical properties the application of a protective layer is a conceivable solution and also described in the prior art, for example in WO 2017081078.

Conceivable methods of protection are lacquering, laminating, adhesive affixing of a protective layer and/or a protective film. However, classical lacquering or adhesive affixing gives rise to manifold problems associated with liquid lacquer and/or adhesives components which on contact with the (B') layer can completely destroy the hologram. Secure adhesive affixing of functionalized films atop solid substrates such as for example glass is generally achieved through the use of optically clear adhesive (OCA) films specifically developed therefor.

However it was found in experiments that the use of such adhesives layers in the hologram generate a color shift when they are brought into contact with the abovementioned irradiated photopolymer films and thus render said hologram unusable. Particularly for RGB holograms and true color holograms even a small wavelength shift of >20 nm (color shift) is problematic since the overall color impression of the hologram is distorted. For this reason it is virtually impossible to achieve secure adhesive affixing of the B layers comprising a hologram atop a carrier such as for example glass while completely retaining the familiar properties.

The problem addressed by the present invention was accordingly that of providing a layer composite of the type mentioned at the outset which may be adhesively bonded to a substrate without the occurrence of a wavelength shift of more than 20 nm in a hologram photoinscribed into the photopolymer film.

The problem has been solved by a layer construction comprising an areal photopolymer layer B and an at least partly cured protective layer C, wherein the protective layer C is obtainable by reaction of an aqueous composition comprising
(I) at least one polyvinyl alcohol,
(II) at least one crosslinker for polyvinyl alcohols,
(III) optionally at least one adhesion promoter, wherein the adhesion promoter is preferably at least one hydrolyzate of an aminoalkyl trialkoxysilane and
(IV) optionally at least one surfactant,
wherein the photopolymer layer B is at least partly joined to the layer C.

Surprisingly the at least partly cured protective layer C constitutes a barrier layer for the liquid organic components of the OCA since this layer is not permeable to the adhesives components and the negative influence thereof on the hologram is thus prevented. It has further been found that, surprisingly, this barrier layer is also effective in the opposite direction, i.e. likewise prevents the escape and possible migration of the components of the photopolymer layer into the adhesives layer, thus making a decisive contribution to the overall stability of the hologram.

It is further possible to apply the protective layer C atop an unirradiated or irradiated photopolymer layer as an aqueous formulation. The layer C according to the invention does not in any way influence the writing process of the holograms in the photopolymer layer and does not reduce their quality. The photosensitivity of the layer construction according to the invention, similarly to the intensity and also the spectral position of the hologram, hardly differs from the values for the original photopolymer layer B without any barrier layer/protective layer C. The layer construction according to the invention makes it possible to use any desired commercial OCA (layer D) to adhesively bond the photopolymer to a solid carrier (layer E), for example glass.

The protective layer C according to the invention protects the photopolymer layer B against physical and chemical influences, such as scratch and solvent damage, with simultaneous good adhesion of the layers of the construction to one another and flexibility and elasticity of the layer construction according to the invention.

The term "areal" in the context of the invention is to be understood as meaning a configuration as a planar area or else as a concavely or convexly vaulted or undulating area. In the context of the invention the hologram-containing photopolymer B must therefore have a planar, vaulted or undulating area in order that laminative application of the sealing layer is made possible in the hologram region at least.

The word "a" in the context of the present invention in connection with countable parameters is to be understood as meaning the number "one" only when this is stated explicitly (for instance by the expression "precisely one"). When reference is made hereinbelow for example to "a polyisocyanate" the word "a" is to be understood as meaning merely the indefinite article and not the number one, this also therefore encompasses an embodiment in which two or more, for example structurally dissimilar, polyisocyanates are present.

In a preferred embodiment the photopolymer layer B is an unirradiated photopolymer layer comprising
I) matrix polymers,
II) writing monomers,
III) photoinitiators, IV) optionally at least one non-photopolymerizable component and
V) optionally catalysts, free-radical stabilizers, solvents, additives and other assistant and/or added substances or the photopolymer layer B is a semi-irradiated photopolymer layer containing a hologram, preferably a volume hologram, wherein the volume hologram is preferably selected from the group consisting of in-line holograms, off-axis holograms, full-aperture transfer holograms, white light transmission holograms, Denisyuk holograms, off-axis reflection holograms, edge-lit holograms and holographic stereograms.

It is preferable when at least one hologram has been photoinscribed in the layer construction according to the invention.

The spectral shift of the transmission spectrum is defined as the difference ($\Delta\lambda$) between the wavelength of the inscribing laser ($\lambda_w$) and the spectral peak of the inscribed hologram ($\lambda_{peak}$) (ISO standard 17901-1:2015(E)):

$$\Delta\lambda = \lambda_{peak} - \lambda_w \quad (1)$$

$\Delta\lambda$ of the inscribed hologram in the inventive layer construction B'-C, A-B'-C, B'-C-D, A-B'-C-D, B'-C-D-E or A-B'-C-D-E is preferably +/−10 nm, more preferably +−5 nm, particularly preferably +/−3 nm, wherein B' is an at least semi-irradiated photopolymer layer comprising an inscribed hologram.

In a preferred embodiment the layer construction according to the invention further contains a substrate layer A, wherein the photopolymer layer B is on one side at least partly joined to the substrate layer A and is on the opposite side at least partly joined to the protective layer C.

In a preferred embodiment the layer construction according to the invention further contains an adhesives layer D, wherein the protective layer C is on one side at least partly joined to the adhesives layer D and is on the opposite side at least partly joined to the photopolymer layer B, wherein the adhesives layer D is preferably an optically clear adhesives layer.

In preferred embodiment of the layer construction according to the invention the photopolymer layer B is disposed atop a substrate layer A, wherein the photopolymer layer B is on one side at least partly joined to the substrate layer A and the photopolymer layer B is on the opposite side at least partly joined to the protective layer C, and the protective layer C is disposed atop an adhesives layer D, wherein the protective layer C is on one side at least partly joined to the adhesives layer D and the protective layer C is on the opposite side at least partly joined to the photopolymer layer B. The layers are arranged in the sequence A-B-C-D. The photopolymer layer B may be an unirradiated, semi-irradiated or irradiated photopolymer layer. The semi-irradiated or irradiated photopolymer layer may contain a hologram of the abovementioned type.

In a preferred embodiment the layer construction according to the invention further contains a substrate layer E, wherein the adhesives layer D is on one side at least partly joined to the substrate layer E and is on the opposite side at least partly joined to protective layer C, wherein the substrate layer is preferably glass.

In preferred embodiment of the layer construction according to the invention the photopolymer layer B is disposed atop a substrate layer A, wherein the photopolymer layer B is on one side at least partly joined to the substrate layer A and the photopolymer layer B is on the opposite side at least partly joined to the protective layer C, and the protective layer C is disposed atop an adhesives layer D, wherein the protective layer C is on one side at least partly joined to the adhesives layer D and the protective layer C is on the opposite side at least partly joined to the photopolymer layer B and the adhesives layer D is disposed atop a substrate layer E, wherein the adhesives layer D is on one side at least partly joined to the protective layer C and the adhesives layer D is on the opposite side at least partly joined to the substrate layer E. The layers are arranged in the sequence A-B-C-D-E. The photopolymer layer B may be an unirradiated, semi-irradiated or irradiated photopolymer layer. The semi-irradiated or irradiated photopolymer layer may contain a hologram of the abovementioned type. The substrate layer E is preferably glass.

In a further embodiment of the layer construction according to the invention the backside of the photopolymer layer B is at least partly joined to a second at least partly cured protective layer C, wherein the layers are arranged directly atop one another in the sequence C-B-C.

In a further embodiment of the layer construction according to the invention the backside of the photopolymer layer B is at least partly joined to a second at least partly cured protective layer C and the first and second protective layer C are on the sides opposite the photopolymer layer each at least partly joined to an adhesives layer D, wherein the layers are arranged in the sequence D-C-BC-D.

In a further embodiment of the layer construction according to the invention the backside of the photopolymer layer B is at least partly joined to a second at least partly cured protective layer C, wherein the first and second protective layer C are on the sides opposite the photopolymer layer B each at least partly joined to an adhesives layer D and the first and second adhesives layer D are on the sides opposite the protective layer C each at least partly joined to a substrate layer D, wherein the layers are arranged in the sequence E-D-C-B-C-D-E. The substrate layer E is preferably glass.

In the abovementioned embodiments of the layer construction according to the invention the second protective layer C may be identical or different from the first protective layer C, the second adhesives layer D may be identical or different from the first adhesives layer D, the second substrate layer E may be identical or different from the first substrate layer E, the photopolymer layer B may be an unirradiated, semi-irradiated or irradiated photopolymer layer and the semi-irradiated or irradiated photopolymer layer may contain a hologram of the abovementioned type.

In a preferred embodiment of the layer construction according to the invention the at least one polyvinyl alcohol according to DIN 53015:2001-02 as a 4% by weight solution in water at 20° C. has a viscosity of ≥25 mPa*s, preferably ≥50 mPa*s.

In a preferred embodiment of the layer construction according to the invention the polyvinyl alcohol according to DIN EN ISO 3681:2007-10-01 has a degree of hydrolysis of ≥85 mol %, more preferably ≥95 mol %.

In a preferred embodiment of the layer construction according to the invention the crosslinker for polyvinyl alcohols is selected from the group consisting of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these.

In a preferred embodiment of the layer construction according to the invention the weight ratio of the respectively employed total amount of the at least one polyvinyl alcohol to the at least one crosslinker is from 70:30 to 90:10, more preferably from 75:25 to 80:20, yet more preferably from 75:25 to 82:18.

In a preferred embodiment of the layer construction according to the invention the cured protective layer C has a layer thickness of 3 µm to 30 µm, preferably 5 µm to 15 µm.

In a preferred embodiment of the layer construction according to the invention the layer construction comprises an areal photopolymer layer B and an at least partly cured protective layer C, wherein the protective layer C is obtainable by reaction of an aqueous composition comprising
(I) at least one polyvinyl alcohol which according to DIN 53015:2001-02 as a 4% by weight solution in water at 20° C. has a viscosity of ≥25 mPa*s, preferably ≥50 mPa*s,
(II) at least one crosslinker for polyvinyl alcohols selected from the group consisting of of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these,
(III) optionally at least one adhesion promoter, wherein the adhesion promoter is preferably at least one hydrolyzate of an aminoalkyl trialkoxysilane and
(IV) optionally at least one surfactant,
wherein the photopolymer layer B is at least partly joined to the layer C.

In a preferred embodiment of the layer construction according to the invention the layer construction comprises an areal photopolymer layer B and an at least partly cured protective layer C, wherein the protective layer C is obtainable by reaction of an aqueous composition comprising
(I) at least one polyvinyl alcohol,
(II) at least one crosslinker for polyvinyl alcohols selected from the group consisting of of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these,
(III) optionally at least one adhesion promoter, wherein the adhesion promoter is preferably at least one hydrolyzate of an aminoalkyl trialkoxysilane and
(IV) optionally at least one surfactant,
wherein the photopolymer layer B is at least partly joined to the layer C and the layer construction further contains an adhesives layer D, wherein the protective layer C is on one side at least partly joined to the adhesives layer D and is on the opposite side at least partly joined to the photopolymer layer B.

In a preferred embodiment of the layer construction according to the invention the layer construction comprises an areal photopolymer layer B and an at least partly cured protective layer C, wherein the protective layer C is obtainable by reaction of an aqueous composition comprising
(I) at least one polyvinyl alcohol which according to DIN 53015:2001-02 as a 4% by weight solution in water at 20° C. has a viscosity of ≥25 mPa*s, preferably ≥50 mPa*s,
(II) at least one crosslinker for polyvinyl alcohols,
(III) optionally at least one adhesion promoter, wherein the adhesion promoter is preferably at least one hydrolyzate of an aminoalkyl trialkoxysilane and
(IV) optionally at least one surfactant,
wherein the photopolymer layer B is at least partly joined to the layer C and the layer construction further contains an adhesives layer D, wherein the protective layer C is on one side at least partly joined to the adhesives layer D and is on the opposite side at least partly joined to the photopolymer layer B.

In a preferred embodiment of the layer construction according to the invention the layer construction comprises an areal photopolymer layer B and an at least partly cured protective layer C, wherein the protective layer C is obtainable by reaction of an aqueous composition comprising
(I) at least one polyvinyl alcohol which according to DIN 53015:2001-02 as a 4% by weight solution in water at 20° C. has a viscosity of ≥25 mPa*s, preferably ≥50 mPa*s,
(II) at least one crosslinker for polyvinyl alcohols selected from the group consisting of of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these,
(III) optionally at least one adhesion promoter, wherein the adhesion promoter is preferably at least one hydrolyzate of an aminoalkyl trialkoxysilane and
(IV) optionally at least one surfactant,
wherein the photopolymer layer B is at least partly joined to the layer C and the layer construction further contains an adhesives layer D, wherein the protective layer C is on one side at least partly joined to the adhesives layer D and is on the opposite side at least partly joined to the photopolymer layer B.

The invention likewise provides a kit of parts containing at least one areal photopolymer layer and an aqueous composition for generating an at least partly cured protective layer C, wherein the aqueous composition comprises
(I) at least one polyvinyl alcohol,
(II) at least one crosslinker for polyvinyl alcohols,
(III) optionally at least one adhesion promoter, wherein the adhesion promoter is preferably at least one hydrolyzate of an aminoalkyl trialkoxysilane and
(IV) optionally at least one surfactant and
wherein the photopolymer layer B is optionally disposed atop a substrate layer A.

In a preferred embodiment of the kit of parts according to the invention the kit of parts further contains an adhesives layer D.

In a preferred embodiment of the kit of parts according to the invention the kit of parts further contains a substrate layer E, preferably glass.

In a preferred embodiment of the kit of parts according to the invention the kit of parts further contains an adhesives layer D and a substrate layer E, wherein the adhesives layer D is preferably an optically clear adhesive layer and the substrate E glass.

In a preferred embodiment of the kit of parts according to the invention the photopolymer layer B is an unirradiated photopolymer layer comprising
I) matrix polymers,
II) writing monomers,
III) photoinitiators, IV) optionally at least one non-photopolymerizable component and V) optionally catalysts, free-radical stabilizers, solvents, additives and other assistant and/or added substances or the photopolymer layer B is a semi-irradiated photopolymer layer containing a hologram, preferably a volume hologram, wherein the volume hologram is preferably selected from the group consisting of in-line holograms, off-axis holograms, full-aperture transfer holograms, white light transmission holograms, Denisyuk holograms, off-axis reflection holograms, edge-lit holograms and holographic stereograms.

In a preferred embodiment of the kit of parts according to the invention the at least one polyvinyl alcohol according to DIN 53015:2001-02 as a 4% by weight solution in water at 20° C. has a viscosity of ≥25 mPa*s, preferably ≥50 mPa*s.

In a preferred embodiment of the kit of parts according to the invention the polyvinyl alcohol according to DIN EN ISO 3681:2007-10-01 has a degree of hydrolysis of ≥85 mol %, more preferably ≥95 mol %.

In a preferred embodiment of the kit of parts according to the invention the crosslinker for polyvinyl alcohols is selected from the group consisting of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these.

In a preferred embodiment of the kit of parts according to the invention the weight ratio of the respectively employed total amount of the at least one polyvinyl alcohol to the at least one crosslinker is from 70:30 to 90:10, more preferably from 75:25 to 80:20, yet more preferably from 75:25 to 82:18.

In a preferred embodiment of the kit of parts according to the invention the cured protective layer C has a layer thickness of 3 µm to 30 µm, preferably 5 µm to 15 µm.

In a preferred embodiment of the kit of parts according to the invention the kit of parts contains at least one areal photopolymer layer and an aqueous composition for generating an at least partly cured protective layer C, wherein the aqueous composition comprises (I) at least one polyvinyl alcohol which according to DIN 53015:2001-02 as a 4% by weight solution in water at 20° C. has a viscosity of ≥25 mPa*s, preferably ≥50 mPa*s, (II) at least one crosslinker for polyvinyl alcohols selected from the group consisting of of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these, (III) optionally at least one adhesion promoter, wherein the adhesion promoter is preferably at least one hydrolyzate of an aminoalkyl trialkoxysilane and (IV) optionally at least one surfactant and wherein the photopolymer layer B is optionally disposed atop a substrate layer A.

In a preferred embodiment of the kit of parts according to the invention the kit of parts contains at least one areal photopolymer layer, an adhesives layer D, a substrate layer E and an aqueous composition for generating an at least partly cured protective layer C, wherein the aqueous composition comprises (I) at least one polyvinyl alcohol which according to DIN 53015:2001-02 as a 4% by weight solution in water at 20° C. has a viscosity of ≥25 mPa*s, preferably ≥50 mPa*s, (II) at least one crosslinker for polyvinyl alcohols, (III) optionally at least one adhesion promoter, wherein the adhesion promoter is preferably at least one hydrolyzate of an aminoalkyl trialkoxysilane and (IV) optionally at least one surfactant and wherein the photopolymer layer B is optionally disposed atop a substrate layer A.

In a preferred embodiment of the kit of parts according to the invention the kit of parts contains at least one areal photopolymer layer, an adhesives layer D, preferably an optically clear adhesive layer, a substrate layer E, preferably glass, and an aqueous composition for generating an at least partly cured protective layer C, wherein the aqueous composition comprises (I) at least one polyvinyl alcohol, (II) at least one crosslinker for polyvinyl alcohols selected from the group consisting of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these, (III) optionally at least one adhesion promoter, wherein the adhesion promoter is preferably at least one hydrolyzate of an aminoalkyl trialkoxysilane and (IV) optionally at least one surfactant and wherein the photopolymer layer B is optionally disposed atop a substrate layer A.

The invention likewise provides a process for producing the layer construction according to the invention, characterized in that initially an at least partly cured protective layer C is applied atop a photopolymer layer B, wherein the photopolymer layer B is optionally disposed atop a substrate layer A, to afford a layer composite B-C or A-B-C, wherein the protective layer C is obtainable by reaction of an aqueous composition comprising (I) at least one polyvinyl alcohol, (II) at least one crosslinker for polyvinyl alcohols, (III) optionally at least one adhesion promoter, wherein the adhesion promoter is preferably at least one hydrolyzate of an aminoalkyl trialkoxysilane and (IV) optionally at least one surfactant.

In a preferred embodiment of the process according to the invention in a further subsequent step an adhesives layer D is applied atop the at least partly cured protective layer C to afford a layer composite B-C-D or A-B-C-D and thereafter in a further subsequent step a substrate layer E is applied atop the adhesives layer D to afford a layer composite B-C-D-E or A-B-C-D-E.

In a preferred embodiment of the process according to the invention a hologram is photoinscribed and fixed into the layer composite B-C, A-B-C, B-C-D, A-B-C-D, B-C-D-E oder A-B-C-D-E.

In a further preferred embodiment of the process according to the invention this comprises the steps of:
producing a light-sensitive holographic film having the layer construction A-B comprising:
preparing a coating material for the production of the photopolymer layer B;

coating the substrate A with this coating material to form the layer composite A-B;
producing a holographic film having the layer construction A-B-C comprising:
preparing an aqueous coating material for the production of the protective layer C comprising
(I) at least one polyvinyl alcohol,
(II) at least one crosslinker for polyvinyl alcohols,
(III) optionally at least one adhesion promoter, wherein the adhesion promoter is preferably at least one hydrolyzate of an aminoalkyl trialkoxysilane and
(IV) optionally at least one surfactant
coating the photopolymer layer B of the layer construction A-B with this coating material to form the layer composite A-B-C;
drying the layer composite A-B-C;
optionally inscribing a hologram into the photopolymer layer B of the layer composite A-B-C to form the layer composite A-B*-C, wherein B* is a photopolymer layer comprising an inscribed hologram;
optionally fixing the hologram in the photopolymer layer B* by areal broadband UV/VIS irradiation of the entire layer construction A-B*-C with a light energy dose of 5-10 J/cm$^2$ to form the layer composite A-B'-C, wherein B' is the bleached, through-polymerized and no-longer-photosensitive photopolymer layer B comprising a fixed hologram;
producing a holographic film having the layer construction A-B-C-D or A-B'-C-D comprising:
applying the adhesives layer D atop the protective layer C of the layer construction A-B-C or A-B'-C to form the layer composite A-B-C-D or A-B'-C-D;
optionally inscribing a hologram into the photopolymer layer B of the layer composite A-B-C-D to form the layer composite A-B*-C-D, wherein B* is a photopolymer layer comprising an inscribed hologram;
optionally fixing the hologram in the photopolymer layer B* by areal broadband UV/VIS irradiation of the entire layer construction A-B*-C-D with a light energy dose of 5-10 J/cm$^2$ to form the layer composite A-B'-C-D, wherein B' is the bleached, through-polymerized and no-longer-photosensitive photopolymer layer B comprising a fixed hologram;
producing a holographic film having the layer construction A-B-C-D-E or A-B'-C-D-E comprising:
applying the adhesives layer E atop the layer construction A-B-C-D or A-B'-C-D to form the layer composite A-B-C-D-E or A-B'-C-D-E;
optionally inscribing a hologram into the photopolymer layer B of the layer composite A-B-C-D-E to form the layer composite A-B*-C-D-E, wherein B* is a photopolymer layer comprising an inscribed hologram;
optionally fixing the hologram in the photopolymer layer B* by areal broadband UV/VIS irradiation of the entire layer construction A-B*-C-D-E with a light energy dose of 5-10 J/cm$^2$ to form the layer composite A-B'-C-D-E, wherein B' is the bleached, through-polymerized and no-longer-photosensitive photopolymer layer B comprising a fixed hologram.
In a further preferred embodiment of the process according to the invention this comprises the steps of:
producing a holographic film having the layer construction A-B'-C comprising:
preparing a coating material for production of the photopolymer layer B;
coating the substrate A with this coating material to form the layer composite A-B;
preparing an aqueous coating material for the production of the protective layer C comprising
(I) at least one polyvinyl alcohol,
(II) at least one crosslinker for polyvinyl alcohols,
(III) optionally at least one adhesion promoter, wherein the adhesion promoter is preferably at least one hydrolyzate of an aminoalkyl trialkoxysilane and
(IV) optionally at least one surfactant
coating the photopolymer layer B of the layer construction A-B with this coating material to form the layer composite A-B-C;
drying the layer composite A-B-C;
inscribing a hologram into the photopolymer layer B of the layer composite A-B-C to form the layer composite A-B*-C, wherein B* is a photopolymer layer comprising an inscribed hologram;
fixing the hologram in the photopolymer layer B* by areal broadband UV/VIS irradiation of the entire layer construction A-B*-C with a light energy dose of 5-10 J/cm$^2$ to form the layer composite A-B'-C, wherein B' is the bleached, through-polymerized and no-longer-photosensitive photopolymer layer B comprising a fixed hologram;
producing a holographic film having the layer construction A-B'-C-D-E comprising:
applying the adhesives layer D atop the protective layer C of the layer construction A-B'-C to form the layer composite A-B'-C-D, preferably by laminative application of the coating material, wherein the adhesives layer D is preferably an OCA film (optically clear adhesive film);
optionally removing the liner film from the OCA adhesives layer;
applying the substrate layer E atop the layer construction A-B'-C-D to form the layer composite A-B'-C-D-E, wherein the substrate layer E is preferably glass and is laminatively applied;
optionally areal broadband UV/VIS irradiation of the entire film construction AB'-C-D-E with a light energy dose of 5-10 J/cm$^2$.
The final optional UV/VIS irradiation of the entire film construction A-B'-C-D-E has the advantage that it causes a UV-curable optically clear adhesive as adhesives layer D, for example OCA-69604 from Tesa SE, Norderstedt, Germany, to undergo curing and final fixing.
In a further preferred embodiment of the process according to the invention this comprises the steps of:
producing a light-sensitive holographic film having the layer construction A-B-C comprising:
preparing a coating material for production of the photopolymer layer B;
coating the substrate A with this coating material to form the layer composite A-B;
preparing an aqueous coating material for the production of the protective layer C comprising
(I) at least one polyvinyl alcohol,
(II) at least one crosslinker for polyvinyl alcohols, (III) optionally at least one adhesion promoter, wherein the adhesion promoter is preferably at least one hydrolyzate of an aminoalkyl trialkoxysilane and (IV) optionally at least one surfactant coating the photopolymer layer B of the layer construction A-B with this coating material to form the layer composite A-B-C;

drying the layer composite A-B-C;

preparing a coating material for the production of the adhesives layer D, wherein the coating material is preferably an OCA film (optically clear adhesive film);

applying the adhesives layer D atop the protective layer C of the layer construction A-B-C in darkness to form the layer composite A-B-C-D, preferably by laminative application of the coating material in darkness;

optionally removing the liner film from the OCA adhesives layer in darkness;

applying the substrate layer E atop the layer construction A-B-C-D in darkness, preferably by laminative application, to form the light-sensitive layer composite AB-C-D-E, wherein the substrate layer E is preferably glass;

producing a holographic film having the layer construction A-B'-C-D-E comprising:

inscribing a hologram into the photopolymer layer B of the layer composite A-BC-D-E to form the layer composite A-B*-C-D-E, wherein B* is a photopolymer layer comprising an inscribed hologram;

fixing the hologram in the photopolymer layer B* by areal broadband UV/VIS irradiation of the entire layer construction A-B*-C with a light energy dose of 5-10 J/cm$^2$ to form the layer composite A-B'-C-D-E, wherein B' is the bleached, through-polymerized and no-longer-photosensitive photopolymer layer B comprising a fixed hologram;

In a preferred embodiment of the process according to the invention the at least one polyvinyl alcohol according to DIN 53015:2001-02 as a 4% by weight solution in water at 20° C. has a viscosity of ≥25 mPa*s, preferably ≥50 mPa*s.

In a preferred embodiment of the process according to the invention the polyvinyl alcohol according to DIN EN ISO 3681:2007-10-01 has a degree of hydrolysis of ≥85 mol %, more preferably ≥95 mol %.

In a preferred embodiment of the process according to the invention the crosslinker for polyvinyl alcohols is selected from the group consisting of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these.

In a preferred embodiment of the process according to the invention the weight ratio of the respectively employed total amount of the at least one polyvinyl alcohol to the at least one crosslinker is from 70:30 to 90:10, more preferably from 75:25 to 80:20, yet more preferably from 75:25 to 82:18.

In a preferred embodiment of the process according to the invention the cured protective layer C has a layer thickness of 3 μm to 30 μm, preferably 5 μm to 15 μm.

The invention likewise provides a layer construction obtainable by the process according to the invention.

Substrate Layer A

The substrate layer A is preferably a thermoplastic substrate layer/substrate film or another carrier, for example glass, plastic, metal or wood. Materials or material composites of the thermopolastic substrate layer A are based on polycarbonate (PC), polyethylene terephthalate (PET), amorphous polyesters, polybutylene terephthalate, polyethylene, polypropylene, cellulose acetate, cellulose hydrate, cellulose nitrate, cycloolefin polymers, polystyrene, hydrogenated polystyrene, polyepoxides, polysulfone, thermoplastic polyurethane (TPU), cellulose triacetate (CTA), polyamide (PA), polymethyl methacrylate (PMMA), polyvinyl chloride, polyvinyl acetate, polyvinylbutyral or polydicyclopentadiene or mixtures thereof. They are particularly preferably based on PC, PET, PA, PMMA and CTA. Material composites may be film laminates or coextrudates. Preferred material composites are duplex and triplex films constructed according to one of the schemes A/B, A/B/A or A/B/C. Particularly preferred are PC/PMMA, PC/PA, PC/PET, PET/PC/PET and PC/TPU. It is preferable when substrate layer A is transparent in the spectral region of 400-800 nm.

Photopolymer Layer B

A hologram may be inscribed into the unirradiated photopolymer layer B, followed by optical fixing of the holotopolymer layer B preferably by areal broadband UV/VIS irradiation of the photopolymer layer comprising the inscribed hologram with a light energy dose of 5-10 J/cm$^2$. During the fixing, residues of writing monomers that were not involved in the local formation of the hologram are through-polymerized in the entire photopolymer layer. The dyes used as sensitizers are likewise photochemically destroyed. The strong technological discoloration of the photopolymer layer B caused by dyes disappears entirely. The photopolymer layer B is bleached by the fixing and is converted into a no-longer-photoactive, dye-free stable photopolymer layer B comprising an inscribed hologram.

In the photopolymer layer one or more holograms may be/may have been photoinscribed at the same location or next to one another. If photoinscribing is performed at the same location different image contents may be photoinscribed. It is likewise possible to photoinscribe different aspects of an object with slightly varying reconstruction angles to form stereograms. It is likewise possible to photoinscribe hidden holograms and microtexts. It is likewise possible in the case of transmission holograms to photoinscribe several light guiding functions and/or light guiding functions for different spectral ranges.

The photopolymer layer B preferably comprises crosslinked matrix polymers, in particular three-dimensionally crosslinked matrix polymers, wherein the matrix polymers are preferably polyurethanes.

The photopolymer layer B comprises matrix polymers, writing monomers and photoinitiators. Employable matrix polymers are amorphous thermoplastics, for example polyacrylates, polymethyl methacrylates or copolymers of methyl methacrylate, methacrylic acid or other alkyl acrylates and alkyl methacrylates, and also acrylic acid, for example polybutyl acrylate, and also polyvinyl acetate and polyvinyl butyrate, the partially hydrolysed derivatives thereof, such as polyvinyl alcohols, and copolymers with ethylene and/or further (meth)acrylates, gelatins, cellulose esters and cellulose ethers such as methyl cellulose, cellulose acetobutyrate, silicones, for example polydimethylsilicone, polyurethanes, polybutadienes and polyisoprenes, and also polyethylene oxides, epoxy resins, in particular aliphatic epoxy resins, polyamides, polycarbonates and the systems cited in U.S. Pat. No. 4,994,347A and therein.

Epoxy resins may be cationically intracrosslinked. In addition, it is also possible to use acids/anhydrides, amines, hydroxyalkyl amides and thiols as crosslinkers. Silicones can be crosslinked either as one-component systems through condensation in the presence of water (and optionally under Brønsted acid catalysis) or as two-component systems by addition of silicic ester or organotin compounds. Hydrosilylation in vinyl-silane systems is also possible.

Unsaturated compounds, for example acryloyl-functional polymers or unsaturated esters, can be crosslinked with amines or thiols. Cationic vinyl ether polymerization is also possible.

However, it is especially preferable when the matrix polymers are crosslinked, preferably three-dimensionally crosslinked, and very particularly preferably are three-dimensionally crosslinked polyurethanes.

Polyurethane matrix polymers are obtainable in particular by reaction of at least one polyisocyanate component a) with at least one isocyanate-reactive component b).

The polyisocyanate component a) comprises at least one organic compound having at least two NCO groups. These organic compounds may in particular be monomeric di- and triisocyanates, polyisocyanates and/or NCO-functional prepolymers. The polyisocyanate component a) may also contain or consist of mixtures of monomeric di- and triisocyanates, polyisocyanates and/or NCO-functional prepolymers.

Employable monomeric di- and triisocyanates include all of the compounds or mixtures thereof well known per se to the person skilled in the art. These compounds may have aromatic, araliphatic, aliphatic or cycloaliphatic structures. In minor amounts the monomeric di- and triisocyanates may also comprise monoisocyanates, i.e. organic compounds having one NCO group.

Examples of suitable monomeric di- and triisocyanates are butane 1,4-diisocyanate, pentane 1,5-diisocyanate, hexane 1,6-diisocyanate (hexamethylene diisocyanate, HDI), 2,2,4-trimethylhexamethylene diisocyanate and/or 2,4,4-trimethylhexamethylene diisocyanate (TMDI), isophorone diisocyanate (IPDI), 1,8-diisocyanato-4-(isocyanatomethyl)octane, bis(4,4'-isocyanatocyclohexyl)methane and/or bis(2',4-isocyanatocyclohexyl)methane and/or mixtures thereof with any isomer content, cyclohexane 1,4-diisocyanate, the isomeric bis(isocyanatomethyl)cyclohexanes, 2,4- and/or 2,6-diisocyanato-1-methylcyclohexane, (hexahydrotolylene 2,4- and/or 2,6-diisocyanate, H6-TDI), phenylene 1,4-diisocyanate, tolylene 2,4- and/or 2,6-diisocyanate (TDI), naphthylene 1,5-diisocyanate (NDI), diphenylmethane 2,4'- and/or 4,4'-diisocyanate (MDI), 1,3-bis(isocyanatomethyl)benzene (XDI) and/or the analogous 1,4 isomer, or any desired mixtures of the aforementioned compounds.

Suitable polyisocyanates are compounds which have urethane, urea, carbodiimide, acylurea, amide, isocyanurate, allophanate, biuret, oxadiazinetrione, uretdione and/or iminooxadiazinedione structures and are obtainable from the aforementioned di- or triisocyanates.

More preferably, the polyisocyanates are oligomerized aliphatic and/or cycloaliphatic di- or triisocyanates, and it is especially possible to use the above aliphatic and/or cycloaliphatic di- or triisocyanates.

Very particular preference is given to polyisocyanates having isocyanurate, uretdione and/or iminooxadiazinedione structures and to biurets based on HDI or mixtures thereof.

Suitable prepolymers contain urethane and/or urea groups, and optionally further structures formed through modification of NCO groups as recited above. Prepolymers of this kind are obtainable, for example, by reaction of the abovementioned monomeric di- and triisocyanates and/or polyisocyanates a1) with isocyanate-reactive compounds b1).

Employable isocyanate-reactive compounds b1) include alcohols or amino or mercapto compounds, preferably alcohols. These may in particular be polyols. Most preferably, the isocyanate-reactive compound b1) used may be polyester polyols, polyether polyols, polycarbonate polyols, poly(meth)acrylate polyols and/or polyurethane polyols.

Suitable polyester polyols are, for example, linear polyester diols or branched polyester polyols which can be obtained in a known manner by reacting aliphatic, cycloaliphatic or aromatic di- or polycarboxylic acids or the anhydrides thereof with polyhydric alcohols of OH functionality $\geq 2$. Examples of suitable di- or polycarboxylic acids are polybasic carboxylic acids such as succinic acid, adipic acid, suberic acid, sebacic acid, decanedicarboxylic acid, phthalic acid, terephthalic acid, isophthalic acid, tetrahydrophthalic acid or trimellitic acid, and acid anhydrides such as phthalic anhydride, trimellitic anhydride or succinic anhydride, or any desired mixtures thereof. The polyester polyols may also be based on natural raw materials such as castor oil. It is likewise possible for the polyester polyols to be based on homo- or copolymers of lactones which are preferably obtainable by addition of lactones or lactone mixtures such as butyrolactone, $\epsilon$-caprolactone and/or methyl-$\epsilon$-caprolactone onto hydroxy-functional compounds such as polyhydric alcohols of OH functionality $\geq 2$, for example of the kind recited below.

Examples of suitable alcohols are all polyhydric alcohols, for example the $C_2$-$C_{12}$ diols, the isomeric cyclohexanediols, glycerol or any desired mixtures thereof with one another.

Suitable polycarbonate polyols are obtainable in a manner known per se by reacting organic carbonates or phosgene with diols or diol mixtures.

Suitable organic carbonates are dimethyl carbonate, diethyl carbonate and diphenyl carbonate.

Suitable diols or mixtures comprise the polyhydric alcohols of OH functionality $\geq 2$ mentioned per se in the context of the polyester segments, preferably butane-1,4-diol, hexane-1,6-diol and/or 3-methylpentanediol. It is also possible to convert polyester polyols to polycarbonate polyols.

Suitable polyether polyols are polyaddition products, optionally of blockwise construction, of cyclic ethers onto OH— or NH-functional starter molecules.

Suitable cyclic ethers are, for example, styrene oxides, ethylene oxide, propylene oxide, tetrahydrofuran, butylene oxide, epichlorohydrin and any desired mixtures thereof.

Starters used may be the polyhydric alcohols of OH functionality $\geq 2$ mentioned per se in the context of the polyester polyols, and also primary or secondary amines and amino alcohols.

Preferred polyether polyols are those of the aforementioned type based exclusively on propylene oxide, or random or block copolymers based on propylene oxide with further 1-alkylene oxides.

Particular preference is given to propylene oxide homopolymers and random or block copolymers having oxyethylene, oxypropylene and/or oxybutylene units, where the proportion of the oxypropylene units based on the total amount of all oxyethylene, oxypropylene and oxybutylene units makes up at least 20% by weight, preferably at least 45% by weight. Oxypropylene and oxybutylene here include all respective linear and branched $C_3$ and $C_4$ isomers.

In addition, suitable constituents of the polyol component b1), as polyfunctional isocyanate-reactive compounds, are also aliphatic, araliphatic or cycloaliphatic di-, tri- or polyfunctional alcohols of low molecular weight, i.e. having molecular weights of ≤500 g/mol, and having short chains, i.e. containing 2 to 20 carbon atoms.

These may be, for example, in addition to the abovementioned compounds, neopentyl glycol, 2-ethyl-2-butylpropanediol, trimethylpentanediol, positionally isomeric diethyloctanediols, cyclohexanediol, cyclohexane-1,4-dimethanol, hexane-1,6-diol, cyclohexane-1,2- and -1,4-diol, hydrogenated bisphenol A, 2,2-bis(4-hydroxycyclohexyl)propane or 2,2-dimethyl-3-hydroxypropionic acid, 2,2-dimethyl-3-hydroxypropyl esters. Examples of suitable triols are trimethylolethane, trimethylolpropane or glycerol. Suitable higher-functionality alcohols are di(trimethylolpropane), pentaerythritol, dipentaerythritol or sorbitol.

It is particularly preferred when the polyol component is a difunctional polyether or polyester or a polyether-polyester block copolyester or a polyether-polyester block copolymer with primary OH functions.

It is likewise possible to use amines as isocyanate-reactive compounds b1). Examples of suitable amines are ethylenediamine, propylenediamine, diaminocyclohexane, 4,4'-dicyclohexylmethanediamine, isophoronediamine (IPDA), difunctional polyamines, for example the Jeffamines®, amine-terminated polymers, in particular having number-average molar masses ≤10 000 g/mol. Mixtures of the aforementioned amines may likewise be used.

It is likewise possible to use amino alcohols as isocyanate-reactive compounds b1). Examples of suitable amino alcohols are the isomeric aminoethanols, the isomeric aminopropanols, the isomeric aminobutanols and the isomeric aminohexanols or any desired mixtures thereof.

All the aforementioned isocyanate-reactive compounds b1) can be mixed with one another as desired.

It is also preferable when the isocyanate-reactive compounds b1) have a number-average molar mass of ≥200 and ≤10,000 g/mol, more preferably ≥500 and ≤8,000 g/mol and very particularly preferably ≥800 and ≤5,000 g/mol. The OH functionality of the polyols is preferably 1.5 to 6.0, particularly preferably 1.8 to 4.0.

The prepolymers of the polyisocyanate component a) may in particular have a residual content of free monomeric di- and triisocyanates of <1% by weight, particularly preferably <0.5% by weight and very particularly preferably <0.3% by weight.

It may also be possible for the polyisocyanate component a) to contain, in full or in part, an organic compound wherein the NCO groups have been fully or partly reacted with blocking agents known from coating technology. Examples of blocking agents are alcohols, lactams, oximes, malonic esters, pyrazoles, and amines, for example butanone oxime, diisopropylamine, diethyl malonate, ethyl acetoacetate, 3,5-dimethylpyrazole, ε-caprolactam, or mixtures thereof.

It is particularly preferable when the polyisocyanate component a) comprises compounds having aliphatically bonded NCO groups, where aliphatically bonded NCO groups are understood to mean those groups bonded to a primary carbon atom. The isocyanate-reactive component b) preferably comprises at least one organic compound having on average least 1.5 and preferably 2 to 3 isocyanate-reactive groups. In the context of the present invention, isocyanate-reactive groups are preferably considered to be hydroxyl, amino or mercapto groups.

The isocyanate-reactive component may in particular comprise compounds having a number average of at least 1.5 and preferably 2 to 3 isocyanate-reactive groups.

Suitable polyfunctional isocyanate-reactive compounds of component b) are for example the above-described compounds b1).

Photoinitiators suitable according to the invention are typically compounds which are activatable by actinic radiation and can initiate polymerization of the writing monomers. Among the photoinitiators a distinction may be made between unimolecular (type I) and bimolecular (type II) initiators. In addition, they are distinguished by their chemical nature in photoinitiators for free-radical, anionic, cationic or mixed types of polymerization.

Type I photoinitiators (Norrish type I) for free-radical photopolymerization on irradiation form free radicals through unimolecular bond scission. Examples of type I photoinitiators are triazines, oximes, benzoin ethers, benzil ketals, bisimidazoles, aroylphosphine oxides, sulfonium salts and iodonium salts.

Type II photoinitiators (Norrish type II) for free-radical polymerization consist of a dye sensitizer and a coinitiator, and undergo a bimolecular reaction on irradiation with light attuned to the dye. The dye at first absorbs a photon and transmits energy to the coinitiator from an excited state. The latter releases the polymerization-initiating free radicals through electron or proton transfer or direct hydrogen abstraction.

In the context of the present invention, preference is given to using type II photoinitiators.

The dye and the coinitiator of the type II photoinitiators may either be directly mixed conjointly with the further components of the photopolymer or alternatively each be singly premixed with individual components. Especially when the photopolymer is to contain polyurethane matrix polymers, the dye may be premixed with the isocyanate-reactive component and the coinitiator with the isocyanate component. However, it is likewise also possible to mix the coinitiator with the isocyanate-reactive component and the dye with the isocyanate component beforehand.

Such photoinitiator systems are described in principle in EP 0 223 587 A and preferably consist of a mixture of one or more dyes with ammonium alkylarylborate(s).

Suitable dyes which, together with an ammonium alkylarylborate, form a type II photoinitiator are the cationic dyes described in WO 2012062655 in combination with the anions likewise described therein.

Suitable ammonium alkylarylborates are for example (Cunningham et al., RadTech'98 North America UV/EB Conference Proceedings, Chicago, Apr. 19-22, 1998): tetrabutylammonium triphenylhexylborate, tetrabutylammonium triphenylbutylborate, tetrabutylammonium trinaphthylhexylborate, tetrabutylammonium tris(4-tert-butyl)phenylbutylborate, tetrabutylammonium tris(3-fluorophenyl)hexylborate ([191726-69-9], CGI 7460, product from BASF SE, Basle, Switzerland), 1-methyl-3-octylimidazolium dipentyldiphenylborate and tetrabutylammonium tris(3-chloro-4-methylphenyl)hexylborate ([1147315-11-4], CGI 909, product from BASF SE, Basle, Switzerland).

It may be advantageous to use mixtures of these photoinitiators. According to the radiation source used, the type and concentration of photoinitiator has to be adjusted in the manner known to those skilled in the art. Further details are described, for example, in P. K. T. Oldring (Ed.), Chemistry & Technology of UV & EB Formulations For Coatings, Inks & Paints, Vol. 3, 1991, SITA Technology, London, p. 61-328.

It is very particularly preferable when the photoinitiator comprises a combination of dyes whose absorption spectra at least partly cover the spectral range from 400 to 800 nm with at least one coinitiator attuned to the dyes.

It is also preferable when at least one photoinitiator suitable for a laser light colour selected from blue, green and red is present in the photopolymer formulation.

It is furthermore preferable when the photopolymer formulation contains a suitable photoinitiator for each of at least two laser light colours selected from blue, green and red.

Finally, it is very particularly preferable when the photopolymer formulation contains a suitable photoinitiator for each of the laser light colours blue, green and red.

A further preferred embodiment provides that the writing monomers comprise a mono- and/or a multifunctional (meth)acrylate writing monomer. The writing monomers may very particularly preferably further comprise at least one mono- and/or one multifunctional urethane (meth)acrylate.

Suitable acrylate writing monomers are in particular compounds of general formula (I)

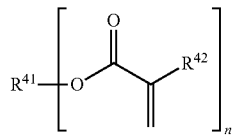

(I)

where n≥1 and n≤4 and $R^{41}$ is a linear, branched, cyclic or heterocyclic unsubstituted or else optionally heteroatom-substituted organic radical and/or $R^{42}$ is hydrogen, a linear, branched, cyclic or heterocyclic unsubstituted or else optionally heteroatom-substituted organic radical. More preferably, $R^{42}$ is hydrogen or methyl and/or $R^{41}$ is a linear, branched, cyclic or heterocyclic organic moiety which is unsubstituted or else optionally substituted by heteroatoms.

Acrylates and methacrylates refer in the present context, respectively, to esters of acrylic acid and methacrylic acid. Examples of acrylates and methacrylates usable with preference are phenyl acrylate, phenyl methacrylate, phenoxyethyl acrylate, phenoxyethyl methacrylate, phenoxyethoxyethyl acrylate, phenoxyethoxyethyl methacrylate, phenylthioethyl acrylate, phenylthioethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, bisphenol A diacrylate, bisphenol A dimethacrylate, and the ethoxylated analogue compounds thereof, N-carbazolyl acrylates.

Urethane acrylates are understood in the present context to mean compounds having at least one acrylic ester group and at least one urethane bond. Such compounds can be obtained, for example, by reacting a hydroxy-functional acrylate or methacrylate with an isocyanate-functional compound.

Examples of isocyanate-functional compounds usable for this purpose are monoisocyanates, and the monomeric diisocyanates, triisocyanates and/or polyisocyanates mentioned under a). Examples of suitable monoisocyanates are phenyl isocyanate, the isomeric methylthiophenyl isocyanates. Di-, tri- or polyisocyanates mentioned above as are triphenylmethane 4,4',4''-triisocyanate and tris(p-isocyanatophenyl) thiophosphate or derivatives thereof having a urethane, urea, carbodiimide, acylurea, isocyanurate, allophanate, biuret, oxadiazinetrione, uretdione or iminooxadiazinedione structure and mixtures thereof. Preference is given here to aromatic di-, tri- or polyisocyanates.

Contemplated hydroxy-functional acrylates or methacrylates for the production of urethane acrylates include, for example, compounds such as 2-hydroxyethyl (meth)acrylate, polyethylene oxide mono(meth)acrylates, polypropylene oxide mono(meth)acrylates, polyalkylene oxide mono (meth)acrylates, poly(ε-caprolactone) mono(meth)acrylates, for example Tone® M100 (Dow, Schwalbach, DE), 2-hydroxypropyl (meth)acrylate, 4-hydroxybutyl (meth)acrylate, 3-hydroxy-2,2-dimethylpropyl (meth)acrylate, hydroxypropyl (meth)acrylate, 2-hydroxy-3-phenoxypropyl acrylate, the hydroxy-functional mono-, di- or tetraacrylates of polyhydric alcohols such as trimethylolpropane, glycerol, pentaerythritol, dipentaerythritol, ethoxylated, propoxylated or alkoxylated trimethylolpropane, glycerol, pentaerythritol, dipentaerythritol or the technical grade mixtures thereof. Preference is given to 2-hydroxyethyl acrylate, hydroxypropyl acrylate, 4-hydroxybutyl acrylate and poly(ε-caprolactone) mono(meth)acrylate.

It is likewise possible to use the known-per-se hydroxyl-containing epoxy (meth)acrylates having OH contents of 20 to 300 mg KOH/g or hydroxyl-containing polyurethane (meth)acrylates having OH contents of 20 to 300 mg KOH/g or acrylated polyacrylates having OH contents of 20 to 300 mg KOH/g and mixtures of these with one another, and mixtures with hydroxyl-containing unsaturated polyesters and mixtures with polyester (meth)acrylates or mixtures of hydroxyl-containing unsaturated polyesters with polyester (meth)acrylates.

Preference is given in particular to urethane acrylates obtainable from the reaction of tris(p-isocyanatophenyl) thiophosphate and/or m-methylthiophenyl isocyanate with alcohol-functional acrylates such as hydroxyethyl (meth)acrylate, hydroxypropyl (meth)acrylate and/or hydroxybutyl (meth)acrylate.

It is likewise possible that the writing monomer comprises further unsaturated compounds such as α,β-unsaturated carboxylic acid derivatives, for example maleates, fumarates, maleimides, acrylamides, and also vinyl ethers, propenyl ethers, allyl ethers and compounds containing dicyclopentadienyl units, and also olefinically unsaturated compounds, for example styrene, α-methylstyrene, vinyltoluene and/or olefins.

In a further preferred embodiment, it is provided that the photopolymer formulation additionally contains monomeric urethanes as additives, in which case the urethanes may especially be substituted by at least one fluorine atom.

The urethanes may preferably have the general formula (II)

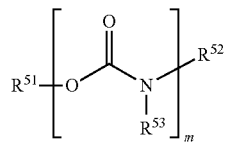

(II)

in which m≥1 and m≤8 and $R^{51}$, $R^{52}$ and $R^{53}$ are linear, branched, cyclic or heterocyclic unsubstituted or else optionally heteroatom-substituted organic radicals and/or $R^{52}$, $R^{53}$ are independently of one another hydrogen, wherein preferably at least one of the radicals $R^{51}$, $R^{52}$, $R^{53}$ is substituted by at least one fluorine atom and particularly preferably $R^{51}$ is an organic radical having at least one fluorine atom. It is particularly preferable when $R^{52}$ is a linear, branched, cyclic or heterocyclic organic radical which is unsubstituted or else optionally substituted with heteroatoms, for example fluorine.

In a further preferred embodiment of the invention, the photopolymer contains 10% to 89.999% by weight, preferably 20% to 70% by weight, of matrix polymers, 3% to 60% by weight, preferably 10% to 50% by weight, of writing monomers, 0.001% to 5% by weight, preferably 0.5% to 3% by weight, of photoinitiators and optionally 0% to 4% by weight, preferably 0% to 2% by weight, of catalysts, 0% to 5% by weight, preferably 0.001% to 1% by weight, of stabilizers, 0% to 40% by weight, preferably 10% to 30% by weight, of monomeric fluorourethanes and 0% to 5% by weight, preferably 0.1% to 5% by weight, of further additives, wherein the sum of all constituents is 100% by weight.

Particular preference is given to using photopolymers comprising 20% to 70% by weight of matrix polymers, 20% to 50% by weight of writing monomers, 0.001% to 5% by weight of photoinitiators, 0% to 2% by weight of catalysts, 0.001% to 1% by weight of free-radical stabilizers, optionally 10% to 30% by weight of fluorourethanes and optionally 0.1% to 5% by weight of further additives.

Employable catalysts include urethanization catalysts, for example organic or inorganic derivatives of bismuth, of tin, of zinc or of iron (see also the compounds specified in US 20121062658). Particularly preferred catalysts are butyltin tris(2-ethylhexanoate), iron(III) trisacetylacetonate, bismuth (III) tris(2-ethylhexanoate) and tin(II) bis(2-ethylhexanoate). In addition, it is also possible to use sterically hindered amines as catalysts.

Employable stabilizers include free-radical inhibitors such as HALS amines, N-alkyl HALS, N-alkoxy HALS and N-alkoxyethyl HALS compounds, and also antioxidants and/or UV absorbers.

Employable further additives include flow control agents and/or antistats and/or thixotropic agents and/or thickeners and/or biocides.

Protective Layer C

The layer C is a protective layer/barrier layer which prevents passage of the liquid organic components of the OCA since this layer is not permeable to the adhesives components. This makes it possible to prevent a negative influence of the adhesives components on the hologram. This barrier layer is also effective in the opposite direction, i.e. escape and possible migration of the components of the photopolymer layer into the adhesives layer is likewise prevented, thus making a decisive contribution to the overall stability of the hologram.

Layer C is obtainable by reaction of a composition containing at least one polyvinyl alcohol, at least one crosslinker for polyvinyl alcohols, optionally at least one adhesion promoter, wherein the adhesion promoter is preferably at least one hydrolyzate of an aminoalkyl trialkoxysilane, optionally at least one surfactant and water as the sole solvent. The protective layer is applied atop the photopolymer layer B as an aqueous formulation containing the abovementioned constituents. Dry application through the use of a solvent free formulation is likewise possible.

As the polyvinyl alcohols it is preferable to employ polyvinyl alcohols having a degree of hydrolysis of more than 85 mol %, more preferably 95 mol % (measured according to DIN EN ISO 3681:2007-10-01). It is particularly preferable when the polyvinyl alcohols have a viscosity ≥25 mPas, yet more preferably of ≥50 mPa*s (measured as a 4% aqueous solution at 20° C. according to DIN 53015: 2001-02).

Preferred polyvinyl alcohols are POVAL 60-98, POVAL 25-88KL and POVAL 25-98R from Kuraray Europe GmbH. These are soluble in hot water and form stable, viscous solutions from which transparent high-tensile-strength and elastic coatings may be produced which adhere very well on several surfaces. It has proven advantageous that such polyvinyl alcohols are insoluble in organic solvents and even in short chain alcohols, thus imparting the films and coatings generated therewith with a particular resistance to organic solvents.

Preferably employed as crosslinkers for thepolyvinyl alcohols are substances selected from the group consisting of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these, Glutaraldehyde, oxalic acid, N,N'-dimethylurea, magnesium hydroxide, calcium hydroxide, boric acid, borate salts, aluminates, aluminum sulfate, silicic acid, silicic esters and/or aqueous glyoxal solution which are added to the solids content of the protective layer C in an amount of up to 25% by weight serve as crosslinkers for polyvinyl alcohol, effect crosslinking during drying and during the associated thermal treatment of the coating and permanently improve the stability thereof. According to the invention crosslinkers whose crosslinking proceeds purely thermally are employed. This has the advantage that during the production of the film the photopolymer layer is safely encapsulated without influencing its photosensitivity.

The weight ratio of the respectively employed total amount of the at least one polyvinyl alcohol to the at least one crosslinker is from 70:30 to 90:10, more preferably from 75:25 to 80:20, yet more preferably from 75:25 to 82:18.

The protective layer C may optionally contain at least one adhesion promoter. Preferred adhesion promoters in the context of the invention are hydrolyzates of aminoalkyl trialkoxysilanes, for example Silquest VS 142 from Momentive. The protective layer preferably contains the adhesion promoters in amounts of up to 2% by weight in the solids content based on the total weight of the solids content.

The protective layer C may optionally comprise at least one surfactant. Preference is given to long-chain alcohols, in particular $C_6$-$C_{18}$ alcohols, more preferably $C_6$-$C_4$ alcohols, yet more preferably $C_8$-$C_{12}$ alcohols, for example 1-octanol or NOVEC fluorosurfactants from 3M. In a particularly preferred embodiment I-octanol is used as the surfactant.

The solvent used for the composition/formulation of the uncured protective layer C is water. The use of water as the solvent has the advantage that the photopolymer layer B is in no way negatively influenced and thus makes possible the roll to roll process of wet application of the protective layer C atop the layer composite A-B. The coating process is performed in darkness with unirradiated and not-yet-fixed photopolymer layers. The thus obtained film having the layer construction A-B-C retains its photosensitivity and allows recording of holograms without further impairment.

The layer C according to the invention does not in any way influence the writing process of the holograms in a layer B and does not reduce their quality. The photosensitivity of the A-B-C film, similarly to intensity and also the spectral position of the hologram, hardly differ from the values for an A-B film without any protective layer/barrier layer.

In a preferred embodiment the cured protective layer C has a layer thickness of 3 µm to 30 µm, preferably 5 µm to 15 µm.

Adhesives Layer D

Suitable as the adhesives layer D are all adhesives that do not interfere with the protective layer C and the substrate layer E. In particular, optically clear adhesives (OCA) are used as the adhesives layer. It is preferable to employ OCA films as the OCA, for example 8211 from 3M, which does not provide for UV curing, and OCA-69604 a UV-curable optically clear adhesive from Tesa SE, Norderstedt, Germany. In the case of UV-curable OCA the curing may be undertaken in the course of the process according to the invention after the photopolymer layer has been irradiated and optically fixed. In a further embodiment the optical fixing and the UV curing of the OCA may be performed in one process step through appropriate choice of the intensity of the applied UV radiation.

Substrate Layer E

The substrate layer E may be a thermoplastic substrate layer/substrate film or another carrier, for example glass, plastic, metal or wood. Materials or material composites of the thermoplastic substrate layer E may be based on polycarbonate (PC), polyethylene terephthalate (PET), amorphous polyesters, polybutylene terephthalate, polyethylene, polypropylene, cellulose acetate, cellulose hydrate, cellulose nitrate, cycloolefin polymers, polystyrene, hydrogenated polystyrene, polyepoxides, polysulfone, thermoplastic polyurethane (TPU), cellulose triacetate (CTA), polyamide (PA), polymethyl methacrylate (PMMA), polyvinyl chloride, polyvinyl acetate, polyvinyl butyral or polydicyclopentadiene or mixtures thereof. The material composites are preferably based on PC, PET, PA, PMMA and CTA. Material composites may be film laminates or coextrudates. Preferred material composites are duplex and triplex films constructed according to one of the schemes A/B, A/B/A or A/B/C. Particularly preferred are PC/PMMA, PC/PA, PC/PET, PET/PC/PET and PC/TPU. It is preferable when substrate layer E is transparent in the spectral range of 400-800 nm.

In a preferred embodiment the substrate layer E is glass.

The invention likewise provides for the use of an at least partly cured protective layer C for protection of a photopolymer layer B, wherein the protective layer C is obtainable by reaction of an aqueous composition comprising
(I) at least one polyvinyl alcohol,
(II) at least one crosslinker for polyvinyl alcohols,
(III) optionally at least one adhesion promoter, wherein the adhesion promoter is preferably at least one hydrolyzate of an aminoalkyl trialkoxysilane and
(IV) optionally at least one surfactant.

In a preferred embodiment of the use according to the invention the at least one polyvinyl alcohol according to DIN 53015:2001-02 as a 4% by weight solution in water at 20° C. has a viscosity of ≥25 mPa*s, preferably ≥50 mPa*s.

In a preferred embodiment of the use according to the invention the polyvinyl alcohol according to DIN EN ISO 3681:2007-10-01 has a degree of hydrolysis of ≥85 mol %, more preferably ≥95 mol %.

In a preferred embodiment of the use according to the invention the crosslinker for polyvinyl alcohols is selected from the group consisting of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these.

A preferred embodiment is the use of an at least partly cured protective layer C for protection of a photopolymer layer B, wherein the protective layer C is obtainable by reaction of an aqueous composition comprising
(I) at least one polyvinyl alcohol which according to DIN 53015:2001-02 as a 4% by weight solution in water at 20° C. has a viscosity of ≥25 mPa*s, preferably ≥50 mPa*s,
(II) at least one crosslinker for polyvinyl alcohols selected from the group consisting of of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these, preferably selected from aqueous glyoxal solution, boric acid, borate salts and/or combinations of at least two of these,
(III) optionally at least one adhesion promoter, wherein the adhesion promoter is preferably at least one hydrolyzate of an aminoalkyl trialkoxysilane and
(IV) optionally at least one surfactant.

The invention likewise provides for the use of the kit of parts according to the invention for protection of a photopolymer layer B preferably containing a volume hologram, more preferably when the photopolymer B' comprises three-dimensionally crosslinked matrix polymers, particularly preferably a three-dimensionally crosslinked polyurethane matrix.

The invention also provides for the use of the kit of parts according to the invention or of the layer construction according to the invention for the process according to the invention.

The invention likewise provides for the use of the layer construction according to the invention as a holographic recording medium.

The invention likewise provides for the use of the layer construction according to the invention for the production of optical displays and security documents, wherein the optical display is preferably selected from the group consisting of autostereoscopic and/or holographic displays, projection screens, displays with switchable restricted emission characteristics for privacy filters and bidirectional multiuser screens, virtual displays, head-up displays, head-mounted displays, illumination symbols, warning lamps, signal lamps, floodlights/headlights and display panels.

In one embodiment the layer construction according to the invention or the kit of parts according to the invention contains a hologram-comprising photopolymer layer having a layer thickness of 0.3 µm to 500 µm, preferably of 0.5 µm to 200 µm and particularly preferably of 1 µm to 100 µm.

In particular the hologram may be a reflection, transmission, in-line, off-axis, full-aperture transfer, white light transmission, Denisyuk, off-axis reflection or edge-lit hologram, or else a holographic stereogram, and preferably a reflection, transmission or edge-lit hologram. Preference is given to reflection holograms, Denisyuk holograms, transmission holograms.

The quality of the hologram is defined by the following criteria in accordance with ISO standard 17901-1:2015(E). In simplified form the hologram may be regarded as an optical grating having a period which in the ideal case is determined by the wavelength of the writing laser ($\lambda_w$). As a diffractive element this grating reflects the light with the wavelength ($\lambda_w$). On account of the high efficiency of the hologram this reflection may be analysed with a spectral in transmission and appears in the spectrum as a peak (at $\lambda_{peak}$) with reduced transmission. This reduction in transmission $$T_{Red} = (100\% - T_{peak(inventive\ layer\ constructing\ e.g.\ A\text{-}B'\text{-}C\text{-}D\text{-}E)}\%) \quad (2)$$

serves as a measure for the reflective power (visible "strength" or "quality") of the hologram.

In the context of the invention the "strength" of the hologram which may be inscribed in the inventive layer construction B-C, A-B-C, B-C-D, A-B-C-D, B-C-D-E oder A-B-C-D-E is not worse at all or not substantially worse than is the case in the construction A-B without any protective layers. This difference $\Delta T$ may be calculated by formula (3):

$$\Delta T (100\% - T_{peak(inventive\ layer\ constructing\ e.g.\ A\text{-}B'\text{-}C\text{-}D\text{-}E)}\%) - (100\% - T_{peak(A\text{-}B')}\%) \quad (3)$$

It is preferable when this difference $\Delta T$ is <20%, particularly preferably <15% and especially preferably <10%.

The spectral shift of the transmission spectrum is defined as the difference ($\Delta\lambda$) between the wavelength of the inscribing laser ($\lambda_w$) and the spectral peak of the inscribed hologram ($\lambda_{peak}$) (ISO standard 17901-1:2015(E)):

$$\Delta\lambda = \lambda_{peak} - \lambda_w \quad (1)$$

It is preferable when $\Delta\lambda$ of the inscribed hologram in the inventive layer construction A-B'-C' is +/−10 nm, more preferably +1-5 nm, particularly preferably +/−3 nm.

In the photopolymer layer one or more holograms may be/may have been photoinscribed at the same location or next to one another. If photoinscribing is performed at the same location different image contents may be photoinscribed. It is likewise possible to photoinscribe different aspects of an object with slightly varying reconstruction angles to form stereograms. It is likewise possible to photoinscribe hidden holograms and microtexts. It is likewise possible in the case of transmission holograms to photoinscribe several light guiding functions and/or light guiding functions for different spectral ranges.

Possible optical functions of the holograms correspond to the optical functions of optical elements such as lenses, mirrors, deflecting mirrors, filters, diffusers, directed diffusion elements, diffraction elements, light guides, waveguides, projection screens and/or masks. In addition, a plurality of such optical functions can be combined in such a hologram, for example such that the light is deflected in a different direction according to the incidence of light. For example, it is possible with such setups to build autostereoscopic or holographic electronic displays which allow a stereoscopic visual impression to be experienced without further aids, for example polarizer or shutter glasses, for use in automobile head-up displays or head-mounted displays.

These optical elements frequently have a specific frequency selectivity according to how the holograms have been exposed and the dimensions of the hologram. This is important in particular when monochromatic light sources such as LEDs or laser light are used. For instance, one hologram is required per complementary colour (RGB), in order to deflect light in a frequency-selective manner and at the same time to enable full-colour displays. Therefore in particular display constructions a plurality of holograms are to be irradiated inside one another in the medium.

In addition, by means of the layer construction according to the invention, it is also possible to produce holographic images or representations, for example for personal portraits, biometric representations in security documents, or generally of images or image structures for advertising, security labels, brand protection, branding, labels, design elements, decorations, illustrations, collectable cards, images and the like, and also images which can represent digital data, including in combination with the products detailed above. Holographic images may have the impression of a three-dimensional image, or else can represent image sequences, short films or a number of different objects, according to the angle from which and the light source with which (including moving light sources) etc. they are illuminated. Because of this variety of possible designs, holograms, especially volume holograms, constitute an attractive technical solution for the abovementioned applications. It is also possible to use such holograms for storage of digital data, using a wide variety of different exposure methods (shift, spatial or angular multiplexing).

The invention likewise provides an optical display comprising a layer construction according to the present invention.

Examples of such optical displays are imaging displays based on liquid crystals, organic light-emitting diodes (OLEDs), LED display panels, microelectromechanical systems (MEMS) based on diffractive light selection, electrowetting displays (E-ink) and plasma display screens. Optical displays of this kind may be autostereoscopic and/or holographic displays, transmittive and reflective projection screens, displays with switchable restricted emission characteristics for privacy filters and bidirectional multiuser screens, virtual displays, head-up displays, head-mounted displays, illumination symbols, warning lamps, signal lamps, floodlights/headlights and display panels.

The invention likewise provides autostereoscopic and/or holographic displays, projection screens, displays with switchable restricted emission characteristics for privacy filters and bidirectional multiuser screens, virtual displays, head-up displays, head-mounted displays, illumination symbols, warning lamps, signal lamps, floodlights/headlights and display panels comprising an inventive layer construction containing a hologram.

The invention still further provides a security document and a holographic optical element comprising an inventive layer construction In addition, the invention also provides for the use of an inventive layer construction for the production of chip cards, identity documents, 3D images, product protection labels, labels, banknotes or holographic optical elements particularly for visual displays.

EXAMPLES

The invention will now be more particularly elucidated by means of examples.

Methods of Measurement:

Solids content: The reported solids contents were determined according to DIN EN ISO 3251.

Chemicals:

In each case, the CAS number, if known, is reported in square brackets.

Raw Materials for Photopolymer Layer B

| | |
|---|---|
| Fomrez ® UL 28 | Urethanization catalyst, commercial product of Momentive Performance Chemicals, Wilton, CT, USA. |
| Borchi ® Kat 22 | Urethanization catalyst, [85203-81-2] commercial product of OMG Borchers GmbH, Langenfeld, Germany. |
| BYK-310 | silicone-containing surface additive, product of BYK-Chemie GmbH, Wesel, Germany. |
| Desmodur ® N 3900 | Product of Covestro AG, Leverkusen, DE, hexane diisocyanate-based polyisocyanate, proportion of iminooxadiazinedione of at least 30%, NCO content: 23.5%. |
| CGI-909 | tetrabutylammonium tris(3-chloro-4-methylphenyl)(hexyl)borate [1147315-11-4], product of BASF SE |

Dye 1 (3,7-bis(diethylamino)phenoxazin-5-ium bis(2-ethylhexyl)sulfosuccinate) was produced as described in WO 2012062655.

Polyol 1 corresponds to Polyol 1 in WO2015091427 and was produced as described therein.

Urethane acrylate 1 (phosphorothioyltris(oxybenzene-4,1-diylcarbamoyloxyethane-2,1-diyl) trisacrylate, [1072454-85-3]) was prepared as described in WO2015091427.

Urethane acrylate 2, (2-({[3-(methylsulfanyl)phenyl]carbamoyl}oxy)ethyl prop-2-enoate, [1207339-61-4]) was produced as described in WO2015091427.

Additive 1, bis(2,2,3,3,4,4,5,5,6,6,7,7-dodecafluoroheptyl)-(2,2,4-trimethylhexane-1,6-diyl)biscarbamate [1799437-41-4] was produced as described in WO2015091427.

Raw Materials for Layer C

Polyvinyl Alcohols

| | |
|---|---|
| POVAL 60-98 - resin 1 | polyvinyl alcohol from Kuraray Europe GmbH, Germany. Product having a degree of hydrolysis of 98 mol % (according to DIN EN ISO 3681: 2007 Oct. 1) and having a viscosity of 60 mPas (measured as a 4% aqueous solution at 20° C. according to DIN 53015: 2001-02); |
| POVAL 25-88KL - resin 2 | polyvinyl alcohol from Kuraray Europe GmbH, Germany. Product having a degree of hydrolysis of 88 mol % (according to DIN EN ISO 3681: 2007 Oct. 1) and having a viscosity of 25 mPas (measured as a 4% aqueous solution at 20° C. according to DIN 53015: 2001-02). |

Crosslinker for Polyvinyl Alcohol

| | |
|---|---|
| Glyoxal solution | [107-22-2] 40%(w/w) in water. Product of Sigma-Aldrich Chemie GmbH., Taufkirchen, Germany |
| Boric acid | [10043-35-3] ReagentPlus ® product (≥99.5%) from Sigma-Aldrich Chemie GmbH, Taufkirchen, Germany. |

Adhesion Promoter (Optional)

| | |
|---|---|
| Silquest VS 142 | aminoalkoxysilane hydrolyzate in water. Product of Momentive Performance Materials, Albany, NY, USA |

Surfactants (Optional)

| | |
|---|---|
| 1-Octanol | [111-87-5] ReagentPlus ® product (99%) from Sigma-Aldrich Chemie GmbH., Taufkirchen, Germany. |

Solvents for Layers B and C

| | |
|---|---|
| Butyl acetate (BA) | Butyl acetate from Brenntag GmbH, Mülheim an der Ruhr, Germany. |
| Ethyl acetate (EA) | Ethyl acetate from Brenntag GmbH, Mülheim an der Ruhr, Germany. |
| 2-Butanone | 2-Butanone from Brenntag GmbH, Mülheim an der Ruhr, Germany. |
| Water | deionized water. |

Optically Clear Adhesives (OCA) of Layer D

| | |
|---|---|
| OCA 8211 - D01 | OCA 8211 acrylic-type OCA product from 3M, St. Paul, MN, USA. Layer thickness of the adhesives layer 25 μm. 50 μm polyester liner. |
| OCA-69604 - D02 | OCA-69604, a UV-curable optically clear adhesive from Tesa SE, Norderstedt, Germany. Layer thickness of the adhesives layer 100 μm. 50 μm and 125 μm polyester liner. |

Glass Substrates of Layer E

| | |
|---|---|
| Schott Glas | Glass sheet having dimensions of 50 mm × 70 mm (3 mm thickness). Product of Schott AG, Mainz, Germany |

Production of Holographic Media (Photopolymer Film)

7.90 g of the above-described polyol component 1 were melted and mixed with 7.65 g of the respective urethane acrylate 2, 2.57 g of the above-described urethane acrylate 1, 5.10 g of the above-described fluorinated urethane (additive 1), 0.91 g of CGI 909, 0.232 g of dye 1, 0.230 g of BYK 310, 0.128 g of Fomrez UL 28 and 3.789 g of ethyl acetate to obtain a clear solution. This was followed by addition of 1.50 g Desmodur® N 3900 and renewed mixing.

This solution was then applied to a PET film of 36 μm in thickness in a roll-to-roll coating plant where by means of a knife coater the product was applied in a wet layer thickness of 19 μm. With a drying temperature of 85° C. and a drying time of 5 minutes, the coated film was dried and then protected with a polyethylene film of 40 μm in thickness. This film (photopolymer film of layer construction A-B) was then light-tightly packaged.

Production of the protective layer/barrier layer C on the photopolymer film A-B The formulations reported in table 1 were produced when the polyvinyl alcohol resins, dissolved at 95° C. in the water and cooled to room temperature were mixed with a crosslinker, surfactant and adhesion promoter (optional).

TABLE 1

Coating material * for production of protective layers C

| Inventive examples | Polyvinyl alcohol | Crosslinker | Adhesion promoter | Weight ratio of polyvinyl alcohol to crosslinker and optionally to adhesion promoter in lacquer | Solids content of aqueous coating solution [% by weight] | Viscosity of solution at 23° C. [mPa*s] |
|---|---|---|---|---|---|---|
| C-01 | 60-98 | glyoxal solution | | 75/25 | 8 | 550 |
| C-02 | 25-88KL | boric acid | | 80/20 | 8 | 802 |
| C-03 | 25-88KL | boric acid | Silquest VS142 | 80/18/2 | 7 | 10900 |

All coating materials include 5 ppm of 1-octanol

TABLE 2-1

Holographic film composites for adhesive bonding onto glass

| Sample | Construction of film composite | Coating material C | Thickness of layer C [μm] | Solvent resistance (1 h) of protective layer C (or B') toward NEP/MEK/butanol/EA | Remarks |
|---|---|---|---|---|---|
| | | | Inventive examples | | |
| P-01 | A-B-C | C-01 | 8 | 2/0/0/0 | photosensitive |
| P-02 | A-B-C | C-02 | 8 | 0/0/0/0 | photosensitive |
| P-03 | A-B-C | C-03 | 7 | 3/0/0/0 | photosensitive |
| P-04 | A-B'-C | C-01 | 8 | 2/0/0/0 | not photosensitive |
| P-05 | A-B'-C | C-02 | 8 | 0/0/0/0 | not photosensitive |
| P-06 | A-B'-C | C-03 | 7 | 3/0/0/0 | not photosensitive |
| | | | Noninventive examples | | |
| PN-01 | A-B | none | none | not tested | photosensitive |
| PN-02 | A-B' | none | none | 5/5/1/5 (after 10 min) | not photosensitive |

The coating materials C-01 to C-03 were applied atop the B-side of the photopolymer film A-B by means of a knife coater in a roll-to-roll coating plant. At a drying temperature of 85° C. and a drying time of 10 minutes the coated film was dried and subsequently protected with a polyethylene film of 40 μm in thickness. The dry layer thickness was generally 7-8 μm. This film (photopolymer film of layer construction A-B-C) was then light-tightly packaged. The thus formed inventive samples P01 to P03 having the structure A-B-C and likewise the noninventive sample PN-01 which has the structure A-B and serves as a comparison are summarized in table 2-1. B is an unirradiated photopolymer layer.

Assessment of Solvent Resistance of Protective Layer C

The solvent resistance of the coatings was typically tested with technical quality N-ethyl-2-pyrrolidone (NEP), methyl ethyl ketone (MEK), 1-butanol and ethyl acetate (EA). The solvents were applied to the coating with a soaked cotton bud and protected from vaporization by covering. Unless otherwise stated, a contact time of 60 minutes at about 23° C. was observed. After the end of the contact time, the cotton bud is removed and the test surface is wiped clean with a soft cloth. This is followed by visual inspection immediately and after light scratching with a fingernail.

A distinction is made between the following levels:
0=unchanged; no change visible; not damageable by scratching.
1=slight swelling visible, but not damageable by scratching.
2=change clearly visible, barely damageable by scratching.
3=noticeable change, surface destroyed after firm fingernail pressure.
4=severe change, scratched through to substrate after firm fingernail pressure.
5=destroyed; lacquer already destroyed on wiping off the chemical; the test substance is not removable (eaten into surface).

Within this assessment, the test is typically passed with performance values of 0 and 1. Performance values of >1 represent a "fail".

As is shown by the corresponding column of table 2-1 all inventive coatings made of coating material C02 register a very high level of solvent resistance. The coatings made of coating material C01 and C03 show a similarly strong performance against methyl ethyl ketone, ethyl acetate and butanol. They show somewhat weaker performance against the strongly aprotic solvent NEP. Nevertheless the values even for NEP are substantially better than for the comparative samples without the protective layer C.

Production of a Film Composite Having the Layer Construction A-B-C-D-E

The production of the film composite having the layer construction A-B-C-D-E comprises an initial lamination of side of the film A-B-C onto the de-linered adhesives layer D of the OCA, thus joining both layers. This is effected by pressing together the two films between the rubber rollers of a laminator. The temperature of the rollers was set to 30° C. The multilayered film produced was cooled to room temperature. The second liner film of the OCA was then peeled off from the film composite. The glass substrate was then laminated onto the side D of the film composite A-B-C-D. The thus formed inventive samples P07 to P09 and P13 to P15 having the layer construction A-B-C-D-E and likewise the noninventive and comparative samples PN-03 and PN-05 having the layer construction A-B-D-E are summarized in table 2-2. B is an unirradiated photopolymer layer.

TABLE 2-2

Composition of photosensitive holographic film composites and no-longer-photosensitive film composites comprising a photoinscribed and fixed hologram adhesively bonded to glass.

| Sample | Structure of film composite | Coating material C | Optically clear adhesive | Remarks |
|---|---|---|---|---|
| Inventive examples | | | | |
| P-07 | A-B-C-D-E | C01 | D01 (3M) | photosensitive |
| P-08 | A-B-C-D-E | C02 | D01 (3M) | photosensitive |
| P-09 | A-B-C-D-E | C03 | D01 (3M) | photosensitive |
| P-10 | A-B'-C-D-E | C01 | D01 (3M) | not photosensitive |
| P-11 | A-B'-C-D-E | C02 | D01 (3M) | not photosensitive |
| P-12 | A-B'-C-D-E | C03 | D01 (3M) | not photosensitive |
| P-13 | A-B-C-D-E | C01 | D02 (Tesa) | photosensitive |
| P-14 | A-B-C-D-E | C02 | D02 (Tesa) | photosensitive |
| P-15 | A-B-C-D-E | C03 | D02 (Tesa) | photosensitive |
| P-16 | A-B'-C-D-E | C01 | D02 (Tesa) | not photosensitive |
| P-17 | A-B'-C-D-E | C02 | D02 (Tesa) | not photosensitive |
| P-18 | A-B'-C-D-E | C03 | D02 (Tesa) | not photosensitive |
| Noninventive examples | | | | |
| PN-03 | A-B-D-E | none | D01 (3M) | photosensitive |
| PN-04 | A-B'-D-E | none | D01 (3M) | not photosensitive |
| PN-05 | A-B-D-E | none | D02 (Tesa) | photosensitive |
| PN-06 | A-B'-D-E | none | D02 (Tesa) | not photosensitive |

Production of Test Holograms in Inventive Film Composites A-B-C and A-B-C-D-E and in Noninventive Film Composites A-Bund A-B-D-E The test holograms were prepared as follows: the photopolymer films with the layer construction A-B and A-B-C were in darkness cut to the desired size and using a rubber roller laminated onto a glass sheet having dimensions of 50 mm×70 mm (3 mm thick). The film composites A-B-C-D-E already include this glass sheets as layer E and were used for the test as they were. The test-holograms were produced using a test apparatus which produces Denisyuk reflection holograms using (532 nm) laser radiation. The test apparatus consists of a laser source, an optical beam guide system and a holder for the glass coupons. The holder for the glass coupons is mounted at an angle of 13° relative to the beam axis. The laser source generated the radiation which, widened to about 5 cm by means of a specific optical beam path, was guided to the glass coupon in optical contact with the mirror. The holographed object was a mirror about 2 cm×2 cm in size, and so the wavefront of the mirror was reconstructed on reconstructing the hologram. All examples were irradiated with a green 532 nm laser (Newport Corp., Irvine, Calif., USA, cat. no. EXLSR-532-50-CDRH). A shutter was used to irradiate the recording film in a defined manner for 2 seconds. This forms a film composite comprising a hologram in the layer B.

Subsequently, the samples were placed onto the conveyor belt of a UV source and irradiated twice at a belt speed of 2.5 m/min. The UV source employed was a Fusion UV "D Bulb" No. 558434 KR 85 iron-doped Hg lamp having a total power density 80 W/cm². The parameters corresponded to a dose of 2×2.5 J/cm² (measured with an ILT 490 Light Bug). Formed after this fixing step are the inventive film composites A-B'-C (table 2-1, samples P04 to P06) and A-B'-C-D-E (table 2-2, samples P10 to P12 and samples P-16 to P-18) and the noninventive and comparative film composites A-B' (table 2-1, sample PN2) and A-B'-D-E (table 2-2, samples PN04 and PN06).

Adhesive Affixing of the Hologram-Including Film Composites A-B'-C/A-B' Atop Glass (Alternative Production of Film Composite A-B'-C-D-E)

The above paragraphs described how the film A-B-C was in darkness pressed with the adhesives film D onto glass (E) and then the hologram was photoinscribed and fixed into the thus formed AB-C-D-E film composite.

An equivalent route consists of inscribing a hologram into the film composite A-B-C and then pressing the thus formed film composite A-B'-C onto glass (E) using the adhesive film D. In the case of the OCA D02 the above described optical fixing was then undertaken.

This formed the inventive film composites A-B'-C-D-E (table 2-3, samples P19 to P24) and the noninventive and comparative film composites A-B'-D-E (table 2-3, samples PN07 and PN08).

TABLE 2-3

Film composites formed by adhesive bonding of glass and a film composite A-B'-C comprising a previously produced hologram

| Sample | Structure of film composite | Coating material C | Optically clear adhesive | Additional UV curing for optically clear adhesive |
|---|---|---|---|---|
| Inventive examples | | | | |
| P-19 | A-B'-C-D-E | C01 | D01 (3M) | no |
| P-20 | A-B'-C-D-E | C02 | D01 (3M) | no |
| P-21 | A-B'-C-D-E | C03 | D01 (3M) | no |
| P-22 | A-B'-C-D-E | C01 | D02 (Tesa) | yes |
| P-23 | A-B'-C-D-E | C02 | D02 (Tesa) | yes |
| P-24 | A-B'-C-D-E | C03 | D02 (Tesa) | yes |
| Noninventive examples | | | | |
| PN-07 | A-B'-D-E | none | D01 (3M) | no |
| PN-08 | A-B'-D-E | none | D02 (Tesa) | yes |

Characterization of Test Holograms

The holograms in layer B' of the film composites A-B'-C, A-B'-C-D-E and A-B' were then analysed for quality by spectroscopy.

On account of the high diffraction efficiency of the volume hologram, the diffractive reflection of such holograms may be analysed in transmission with visible light with a spectrometer (USB 2000 instrument, Ocean Optics, Dunedin, Fla., USA, was employed) and appears in the transmission spectrum as a peak with reduced transmission $T_{Red}$. Evaluating the transmission curve makes it possible to determine the quality of the hologram according to ISO standard 17901-1:2015(E) taking account of the following measured values; all results are summarized in tables 3-1 to 3-3 and in tables 4-1 to 4-3 in the section "spectral quality of holograms":

$T_{Red} \times 100 - T_{peak}$(2) Maximum depth of the transmission peak, this corresponds to the highest diffraction efficiency. Thus, $100 - T_{peak}$ serves as a measure for the reflection power (or visible "strength" or "quality") of the hologram.

FWHM The width of the transmission peak is determined as "full width at half maximum" (FWHM) in nanometres (nm).

$\lambda_{peak}$ Spectral position of the transmission minimum of the hologram in nanometres (nm).

$\Delta\lambda_{peak}$ spectral shift of the transmission minimum of the hologram in nanometers (nm) relative to the first measurement of the sample shown in respective line of the table The quality of the inventive protective layers was assessed by initially inscribing test holograms into the photopolymer and subsequently storing the layer constructions to be evaluated in each case under different conditions. The results obtained are summarized in tables 3-1, 3-2, 3-3, 4-1, 4-2 and 4-3.

Tables 3-1, 3-2 and 3-3 show the results for the holograms that were inscribed into the A-B-C-D-E film composite and then subjected to UV-VIS fixing. D02 also undergoes final curing here. The freshly produced hologram was subjected to spectroscopic measurement. Samples were then stored for different lengths of time under a wide variety of external conditions and the hologram was then subjected to spectroscopic measurement once more.

Tables 4-1, 4-2 and 4-3 summarize the results where holograms were inscribed into the A-B-C film composite and then subjected to UV-VIS fixing. The holograms of the formed film composite AB'-C were subjected to spectroscopic measurement. An optically clear adhesive (OCA) was subsequently laminated onto the C-layer and the backing film of the OCA was removed. The adhesive side of the film composite was laminated onto glass and adhesively bonded. In the case of the Tesa product (D02) the film composite is additionally UV cured. The film composite A-B'-C-D-E and the noninventive comparator A-B'-D-E were then subjected to spectroscopic measurement, stored under the specified conditions and subjected to spectroscopic measurement once again.

Film Composites A-B-C and A-B-C-D-E as Holographic Recording Media

The application of the protective layer C atop the film A-B by roll to roll coating results in a film composite A-B-C whose suitability for recording holograms may be assessed on the basis of the results in tables 3-1 to 3-3 and 4-1 to 4-3.

The characteristics of the holograms recorded in the standard films A-B are shown in tables 4-1 to 4-3 (column "in A-B") for the noninventive samples PN-07-01 to PN-07-03 and PN-08-01 to PN08-03.

The inventive samples P-19 to P-24 (in the same three tables—column "in A-B'-C") display the holograms with identical performance in respect of intensity ($100-T_{peak}$), peak width (FWHM) and the position ($\lambda_{peak}$) of the peak maximum.

This means that the protective layer C does not influence the recording capabilities of the holographic film A-B. As recording material for holograms the A-B-C films are equivalent to the A-B films.

Adhesive bonding of such A-B-C films onto glass with an OCA then affords the photosensitive film composites A-B-C-D-E whose performance for recording of the holograms may likewise be assessed on the basis of the results in table 3-1 to 3-3 and 4-1 to 4-3.

The inventive samples P-10 to P-18 (in tables 3-1 to 3-3—column "in A-B'-C-D-E after 5 min at RT") display the holograms with identical performance in respect of intensity ($100-T_{peak}$), peak width (FWHM) and the position ($\lambda_{peak}$) of the peak maximum as do the above-described inventive samples P-19 to P-24 formed from the A-B-C films (in tables 4-1 to 4-3—column "in A-B'-C").

This means that the protective layer C provides effective protection of the recording medium B from for example an OCA layer D. The inventive film composites A-B-C-D-E in which the photosensitive inventive films A-B-C are adhesively bonded onto glass with the OCA are equal as holographic recording media to these not-yet-adhesively affixed films and the A-B films.

Without the protective layer C only very faint holograms with a severely shifted position of the spectral maximum are inscribable into the layer B (noninventive samples PN-04-01 to PN-04-03 and PN-06-01 to PN-06-03 (tables 3-1 to 3-3—column "in A-B'-D-E after 5 min at RT")). In addition, these samples are not storage stable. Without the protective layer C film composites having such a construction are not usable as recording media.

Storage Stability of the Film Composites A-B'-C-D-E

The storage stability of the film composites A-B'-C-D-E may be rated by means of the quality of the holograms inscribed in the layer B' such as for example in the inventive examples P-10 to P-18. The results of storage under different conditions is summarized in tables 3-1 to 3-3. Storage at room temperature for a duration of one day or one week (table 3-1) results in only very minimal changes, if any, to holograms. By contrast, the noninventive samples PN-04 and PN-06 without protective layer C even under these mild conditions show severe changes to the spectral properties of the holograms which become fainter (100–$T_{peak}$) and which undergo a severe shift in their absorption maximum ($\Delta\lambda_{peak}$).

Table 3-2 shows the results of storage at 80° C. (for one hour and for three days). The holograms of the inventive samples P-10 bis P-18 remain very stable.

Table 3-3 shows the results of storage at 80° C. and 95% relative atmospheric humidity for 3 days. The holograms of the inventive samples P-10 to P-18 are well preserved in terms of their intensity and their absorption maximum undergoes only a slight spectral shift even under these conditions. This spectral shift differentiates different compositions of the protective layer C. Variant C01 is particularly suitable for such storage conditions. The sample P-10-03 (protective layer C01 in combination with the OCA D01 (3M)) for example shows no measurable spectral influence on the hologram.

Storage Stability of the Film Composites A-B'-C Later Adhesively Affixed onto Glass The storage stability of the thus produced film composites A-B'-C-D-E may be rated by means of the quality of the holograms inscribed in the layer B' such as for example of the inventive examples P-19 to P-24. The results of storage under different conditions is summarized in tables 4-1 to 4-3. Storage at room temperature for a duration of one day or one week (table 4-1) results in only very minimal changes, if any, to holograms. By contrast, the noninventive samples PN-07 and PN08 without protective layer C even under these mild conditions show severe changes to the spectral properties of the holograms which become fainter (100–$T_{peak}$) and which undergo a severe shift in their absorption maximum ($\Delta\lambda_{peak}$).

Table 4-2 shows the results of storage at 80° C. (for one hour and for three days). The holograms of the inventive samples P-19 bis P-24 remain very stable.

Table 4-3 shows the results of storage at 80° C. and 95% relative atmospheric humidity for 3 days. The holograms of the inventive samples P-19 to P-24 are well preserved in terms of their intensity and their absorption maximum undergoes only a slight spectral shift even under these conditions. This spectral shift differentiates different compositions of the protective layer C. Variant C01 is particularly suitable for such storage conditions. The sample P-19-03 (protective layer C01 in combination with the OCA D01 (3M)) for example shows no measurable spectral influence on the hologram.

TABLE 3-1

Assessment of quality of protective layer C: Test holograms were inscribed into the A-B-C-D-E film composite and then fixed with 5-10 J/cm² of UV-VIS to form the film composite A-B'-C-D-E. The inscribed holograms was subjected to spectroscopic measurement, stored under the specified conditions and subjected to measurement once again.

| | Coating | | Spectral quality of holograms | | | | | | | | | | |
|---|---|---|---|---|---|---|---|---|---|---|---|---|---|
| | | | in A-B'-C-D-E (after 5 min at RT) | | | in A-B'-C-D-E (after 1 day at RT) | | | | in A-B'-C-D-E (after 1 week at RT) | | | |
| Sample | material C | OCA (layer D) | 100-$T_{peak}$ [%] | FWHM [nm] | $\lambda_{peak}$ [nm] | 100-$T_{peak}$ [%] | FWHM [nm] | $\lambda_{peak}$ [nm] | $\Delta\lambda_{peak}$ [nm] | 100-$T_{peak}$ [%] | FWHM [nm] | $\lambda_{peak}$ [nm] | $\Delta\lambda_{peak}$ [nm] |
| | | | | | Inventive examples | | | | | | | | |
| P-10-01 | C01 | D01 (3M) | 73.5 | 14.8 | 530.4 | 82.0 | 15.0 | 529.7 | −0.7 | 81.1 | 14.8 | 529.0 | −1.4 |
| P-11-01 | C02 | D01 (3M) | 76.3 | 14.5 | 531.4 | 65.4 | 18.7 | 530.4 | −1.0 | 65.8 | 18.4 | 529.7 | −1.7 |
| P-12-01 | C03 | D01 (3M) | 78.1 | 16.0 | 530.4 | 77.7 | 16.6 | 530.0 | −0.4 | 75.1 | 15.7 | 529.3 | −1.1 |
| P-16-01 | C01 | D02 (Tesa)* | 78.1 | 15.5 | 529.7 | 76.9 | 15.4 | 529.4 | −0.3 | 76.2 | 15.2 | 529.4 | −0.3 |
| P-17-01 | C02 | D02 (Tesa)* | 74.2 | 15.9 | 529.7 | 76.0 | 16.9 | 529.7 | 0 | 77.1 | 17.1 | 529.7 | 0 |
| P-18-01 | C03 | D02 (Tesa)* | 74.8 | 16.3 | 529.4 | 74.9 | 16.2 | 529.7 | 0.3 | 69.7 | 16.0 | 529.4 | 0 |
| | | | | | Noninventive examples | | | | | | | | |
| | | | in A-B'-D-E (after 5 min at RT) | | | in A-B'-D-E (after 1 day at RT) | | | | in A-B'-D-E (after 1 week at RT) | | | |
| PN-04-01 | none | D01 (3M) | 63.9 | 15.3 | 508.0 | 36.0 | 12.5 | 460.7 | −47.3 | 32.8 | 14.2 | 472.4 | −35.6 |
| PN-06-01 | none | D02 (Tesa)* | 26.5 | 16.5 | 527.6 | 19.2 | 17.6 | 501.4 | −26.2 | 17.8 | 18.1 | 491.9 | −35.7 |

*D02 also undergoes curing during irradiation

TABLE 3-2

Assessment of quality of protective layer C: Test holograms were inscribed into the A-B-C-D-E film composite and then fixed with 5-10 J/cm² of UV-VIS to form the film composite A-B'-C-D-E. The inscribed holograms was subjected to spectroscopic measurement, stored under the specified conditions and subjected to measurement once again.

| | Coating | | Spectral quality of holograms | | | | | | | | | |
|---|---|---|---|---|---|---|---|---|---|---|---|---|
| | | | in A-B'-C-D-E (after 5 min at RT) | | | in A-B'-C-D-E (after 1 h; 80° C.) | | | | in A-B'-C-D-E (after 3 days; 80° C.) | | | |
| Sample | material C | OCA (layer D) | 100-$T_{peak}$ [%] | FWHM [nm] | $\lambda_{peak}$ [nm] | 100-$T_{peak}$ [%] | FWHM [nm] | $\lambda_{peak}$ [nm] | $\Delta\lambda_{peak}$ [nm] | 100-$T_{peak}$ [%] | FWHM [nm] | $\lambda_{peak}$ [nm] | $\Delta\lambda_{peak}$ [nm] |
| Inventive examples | | | | | | | | | | | | | |
| P-10-02 | C01 | D01 (3M) | 73.6 | 14.9 | 530.4 | 77.4 | 15.2 | 532.8 | 2.4 | 77.9 | 15.3 | 533.2 | 2.8 |
| P-11-02 | C02 | D01 (3M) | 76.3 | 14.6 | 531.5 | 78.7 | 16.4 | 531.4 | −0.1 | 78.0 | 16.4 | 532.5 | 1.0 |
| P-12-02 | C03 | D01 (3M) | 78.1 | 16.1 | 530.4 | 76.5 | 16.3 | 532.1 | 1.7 | 78.8 | 16.6 | 532.8 | 2.4 |
| P-16-02 | C01 | D02 (Tesa)* | 71.3 | 14.8 | 529.4 | 75.7 | 16.3 | 533.2 | 3.8 | 70.6 | 16.2 | 532.5 | 3.1 |
| P-17-02 | C02 | D02 (Tesa)* | 74.9 | 15.9 | 529.7 | 76.8 | 17.3 | 533.2 | 3.5 | 74.6 | 16.9 | 532.9 | 3.2 |
| P-18-02 | C03 | D02 (Tesa)* | 71.4 | 16.5 | 529.7 | 69.4 | 16.4 | 532.9 | 3.2 | 67.5 | 16.6 | 531.8 | 2.1 |
| Noninventive examples | | | | | | | | | | | | | |
| | | | in A-B'-D-E (after 5 min at RT) | | | in A-B'-D-E (after 1 h; 80° C.) | | | | in A-B'-D-E (after 3 days; 80° C.) | | | |
| PN-04-02 | none | D01 (3M) | 63.9 | 15.4 | 508.1 | 42.7 | 11.8 | 440.0 | −68.1 | 39.6 | 11.7 | 446.8 | −61.3 |
| PN-06-02 | none | D02 (Tesa)* | 30.3 | 14.5 | 525.5 | 22.4 | 20.5 | 488.4 | −37.1 | 18.2 | 14.6 | 485.9 | −39.6 |

*D02 also undergoes curing during irradiation

TABLE 3-3

Assessment of quality of protective layer C: Test holograms were inscribed into the A-B-C-D-E film composite and then fixed with 5-10 J/cm² of UV-VIS to form the film composite A-B'-C-D-E. The inscribed holograms was subjected to spectroscopic measurement, stored under the specified conditions and subjected to measurement once again.

| | Coating | | Spectral quality of holograms | | | | | | |
|---|---|---|---|---|---|---|---|---|---|
| | | | in A-B'-C-D-E (after 5 min at RT) | | | in A-B'-C-D-E (after 3 days; 80° C.; 95% AH) | | | |
| Sample | material C | OCA (layer D) | 100-$T_{peak}$ [%] | FWHM [nm] | $\lambda_{peak}$ [nm] | 100-$T_{peak}$ [%] | FWHM [nm] | $\lambda_{peak}$ [nm] | $\Delta\lambda_{peak}$ [nm] |
| Inventive examples | | | | | | | | | |
| P-10-03 | C01 | D01 (3M) | 78.4 | 14.5 | 528.7 | 79.2 | 16.0 | 531.1 | 2.4 |
| P-11-03 | C02 | D01 (3M) | 52.5 | 17.9 | 530.1 | 60.5 | 17.5 | 518.6 | −11.5 |
| P-12-03 | C03 | D01 (3M) | 74.6 | 15.8 | 529.4 | 70.4 | 15.1 | 515.8 | −13.6 |
| P-16-03 | C01 | D02 (Tesa)* | 75.0 | 16.2 | 529.4 | 78.1 | 16.4 | 526.9 | −2.5 |
| P-17-03 | C02 | D02 (Tesa)* | 70.6 | 15.8 | 529.7 | 75.2 | 15.7 | 519.6 | −10.1 |
| P-18-03 | C03 | D02 (Tesa)* | 75.1 | 15.6 | 529.7 | 66.5 | 14.6 | 518.2 | −11.5 |
| Noninventive examples | | | | | | | | | |
| | | | in A-B'-D-E (after 5 min at RT) | | | in A-B'-D-E (after 3 days; 80° C.; 95% AH) | | | |
| PN-04-03 | none | D01 (3M) | 31.6 | 12.8 | 470.4 | 13.0 | # | 400.1 | −70.3 |
| PN-06-03 | none | D02 (Tesa)* | 19.5 | 15.1 | 524.2 | 7.1 | 19.8 | 497.9 | −26.3 |

*D02 also undergoes curing during irradiation

TABLE 4-1

Assessment of quality of protective layer C: Test holograms were inscribed into the A-B-C film composite and then fixed with 5-10 J/cm$^2$ of UV-VIS to form the film composite A-B'-C. The recited optically clear adhesive (OCA) was laminated onto this film composite and the backing film of the OCA was removed. The adhesive side of the film composite A-B'-C-D was laminated onto glass. The holograms were subjected to spectroscopic measurements before and after the storage under the specified conditions.

| | | | | | | | in A-B'-C-D-E (after 1 h at RT) | | | | in A-B'-C-D-E (after 1 week at RT) | | | |
|---|---|---|---|---|---|---|---|---|---|---|---|---|---|---|
| | Coating | | in A-B'-C | | | | | | $\Delta\lambda_{peak}$ vs | | | | $\Delta\lambda_{peak}$ vs |
| Sample | material C | OCA (layer D) | 100-T$_{peak}$ [%] | FWHM [nm] | $\lambda_{peak}$ [nm] | 100-T$_{peak}$ [%] | FWHM [nm] | $\lambda_{peak}$ [nm] | A-B'-C [nm] | 100-T$_{peak}$ [%] | FWHM [nm] | $\lambda_{peak}$ [nm] | A-B'-C [nm] |
| | | | | | Inventive examples | | | | | | | | |
| P-19-01 | C01 | D01 (3M) | 73.8 | 14.7 | 529.4 | 70.7 | 14.9 | 528.7 | −0.7 | 69.8 | 14.9 | 530.1 | 0.7 |
| P-20-01 | C02 | D01 (3M) | 75.6 | 15.9 | 529.7 | 81.0 | 16.5 | 529.4 | −0.3 | 74.2 | 15.5 | 530.4 | 0.7 |
| P-21-01 | C03 | D01 (3M) | 78.7 | 15.8 | 530.8 | 77.5 | 15.5 | 530.4 | −0.4 | 79.0 | 15.8 | 531.1 | 0.3 |
| P-22-01 | C01 | D02 (Tesa) | 66.1 | 16.6 | 530.4 | 62.2 | 16.1 | 530.8 | 0.4 | 53.5 | 15.1 | 530.4 | 0 |
| P-23-01 | C02 | D02 (Tesa) | 65.9 | 17.4 | 529.4 | 67.6 | 17.8 | 529.7 | 0.3 | 67.2 | 16.4 | 529.7 | 0.3 |
| P-24-01 | C03 | D02 (Tesa) | 72.3 | 16.8 | 529.7 | 74.7 | 17.2 | 530.1 | 0.4 | 73.8 | 17.4 | 530.1 | 0.4 |
| | | | | | Noninventive examples | | | | | | | | |
| | | | in A-B' | | | in A-B'-C-D-E (after 1 h at RT) | | | | in A-B'-C-D-E (after 1 week at RT) | | | |
| PN-07-01 | none | D01 (3M) | 72.9 | 15.9 | 529.7 | 65.5 | 16.3 | 522.4 | −5.3 | 42.0 | 10.45 | 442.9 | −86.8 |
| PN-08-01 | none | D02 (Tesa) | 56.7 | 14.7 | 529.4 | 47.1 | 4.6 | 517.5 | −11.9 | 30.1 | 12.4 | 442.9 | −86.5 |

* D02 also undergoes curing during irradiation

TABLE 4-2

Assessment of quality of protective layer C: Test holograms were inscribed into the A-B-C film composite and then fixed with 5-10 J/cm$^2$ of UV-VIS to form the film composite A-B'-C. The recited optically clear adhesive (OCA) was laminated onto this film composite and the backing film of the OCA was removed. The adhesive side of the film composite A-B'-C-D was laminated onto glass. The holograms were subjected to spectroscopic measurements before and after the storage under the specified conditions.

| | | | | | | | in A-B'-C-D-E (after 1 h at 80° C.) | | | | in A-B'-C-D-E (after 3 days at 80° C.) | | | |
|---|---|---|---|---|---|---|---|---|---|---|---|---|---|---|
| | Coating | | in A-B'-C | | | | | | $\Delta\lambda_{peak}$ vs | | | | $\Delta\lambda_{peak}$ vs |
| Sample | material C | OCA (layer D) | 100-T$_{peak}$ [%] | FWHM [nm] | $\lambda_{peak}$ [nm] | 100-T$_{peak}$ [%] | FWHM [nm] | $\lambda_{peak}$ [nm] | A-B'-C [nm] | 100-T$_{peak}$ [%] | FWHM [nm] | $\lambda_{peak}$ [nm] | A-B'-C [nm] |
| | | | | | Inventive examples | | | | | | | | |
| P-19-02 | C01 | D01 (3M) | 72.7 | 15.0 | 529.0 | 74.4 | 15.2 | 535.6 | 6.6 | 71.2 | 15.0 | 533.8 | 4.8 |
| P-20-02 | C02 | D01 (3M) | 83.1 | 15.5 | 530.0 | 78.9 | 15.7 | 531.4 | 1.4 | 78.9 | 14.9 | 531.1 | 1.1 |
| P-21-02 | C03 | D01 (3M) | 80.5 | 16.3 | 530.0 | 78.8 | 16.1 | 534.2 | 4.2 | 74.3 | 15.3 | 533.8 | 3.8 |
| P-22-02 | C01 | D02 (Tesa) | 65.4 | 15.4 | 529.7 | 67.1 | 16.3 | 534.6 | 4.9 | 68.4 | 16.2 | 533.9 | 4.2 |
| P-23-02 | C02 | D02 (Tesa) | 67.8 | 16.9 | 530.8 | 37.1 | 19.3 | 532.9 | 2.1 | 46.3 | 18.1 | 531.1 | 0.3 |
| P-24-02 | C03 | D02 (Tesa) | 74.6 | 16.0 | 529.4 | 76.2 | 17.1 | 531.8 | 2.4 | 76.1 | 16.8 | 530.8 | 1.4 |
| | | | | | Noninventive examples | | | | | | | | |
| | | | in A-B' | | | in A-B'-C-D-E (after 1 h at 80° C.) | | | | in A-B'-C-D-E (after 3 days at 80° C.) | | | |
| PN-07-02 | none | D01 (3M) | 74.1 | 17.2 | 528.3 | 37.4 | 11.1 | 440.4 | −87.9 | 37.5 | 12.2 | 449.7 | −78.6 |
| PN-08-02 | none | D02 (Tesa) | 74.0 | 15.6 | 528.7 | 33.5 | 12.2 | 438.6 | −90.1 | 30.5 | 12.1 | 444.4 | −84.3 |

* D02 also undergoes curing during irradiation

TABLE 4-3

Assessment of quality of protective layer C: Test holograms were inscribed into the A-B-C film composite and then fixed with 5-10 J/cm² of UV-VIS to form the film composite A-B'-C. The recited optically clear adhesive (OCA) was laminated onto this film composite and the backing film of the OCA was removed. The adhesive side of the film composite A-B'-C-D was laminated onto glass. The holograms were subjected to spectroscopic measurements before and after the storage under the specified conditions.

| | | | Spectral quality of holograms | | | | | |
|---|---|---|---|---|---|---|---|---|
| | | | in A-B'-C | | | in A-B'-C-D-E (after 3 days at 80° C.; 95% AH) | | |
| | Coating | | | | | | | $\Delta\lambda_{peak}$ vs |
| Sample | material C | OCA (layer D) | 100-$T_{peak}$ [%] | FWHM [nm] | $\lambda_{peak}$ [nm] | 100-$T_{peak}$ [%] | FWHM [nm] | $\lambda_{peak}$ [nm] | A-B'-C [nm] |
| | | | Inventive examples | | | | | |
| P-19-03 | C01 | D01 (3M) | 73.1 | 14.4 | 529.0 | 62.4 | 13.6 | 533.2 | 4.2 |
| P-20-03 | C02 | D01 (3M) | 80.9 | 15.6 | 529.3 | 76.8 | 15.7 | 522.0 | -7.3 |
| P-21-03 | C03 | D01 (3M) | 75.0 | 14.8 | 530.7 | 74.4 | 14.7 | 522.0 | -8.7 |
| P-22-03 | C01 | D02 (Tesa)* | 71.9 | 15.4 | 531.1 | 77.3 | 15.9 | 527.6 | -3.5 |
| P-24-03 | C03 | D02 (Tesa)* | 75.1 | 16.7 | 528.7 | 74.6 | 16.1 | 519.6 | -9.1 |
| Noninventive examples | | | in A-B' | | | in A-B'-D-E (after 3 days at 80° C.; 95% AH) | | | |
| PN-07-03 | none | D01 (3M) | 67.4 | 17.5 | 525.9 | 10.2 | # | 430.0 | -95.9 |
| PN-08-03 | none | D02 (Tesa)* | 65.4 | 15.1 | 529.4 | 31.5 | 11.1 | 452.2 | -77.2 |

*D02 also undergoes curing during irradiation

The invention claimed is:

1. A layer construction comprising an areal photopolymer layer B and an at least partly cured protective layer C obtained by reaction of an aqueous composition comprising
   (I) at least one polyvinyl alcohol,
   (II) at least one crosslinker for polyvinyl alcohols,
   (III) optionally at least one adhesion promoter, wherein the adhesion promoter is preferably at least one hydrolyzate of an aminoalkyl trialkoxysilane and
   (IV) optionally at least one surfactant,
   wherein the photopolymer layer B is at least partly joined to the layer C.

2. The layer construction according to claim 1, wherein the photopolymer layer B is an unirradiated photopolymer layer comprising
   (I) matrix polymers,
   (II) writing monomers,
   (III) photoinitiators,
   (IV) optionally at least one non-photopolymerizable component and
   (V) optionally catalysts, free-radical stabilizers, solvents, additives and other assistant and/or added substances, or the photopolymer layer B is a semi-irradiated photopolymer layer containing a hologram, preferably a volume hologram, wherein the volume hologram is preferably selected from the group consisting of in-line holograms, off-axis holograms, full-aperture transfer holograms, white light transmission holograms, Denisyuk holograms, off-axis reflection holograms, edge-lit holograms and holographic stereograms.

3. The layer construction according to claim 1, wherein the layer construction further contains a substrate layer A, wherein the photopolymer layer B is on one side at least partly joined to the substrate layer A and is on the opposite side at least partly joined to the protective layer C.

4. The layer construction according to claim 1, wherein the layer construction further contains an adhesives layer D, wherein the protective layer C is on one side at least partly joined to the adhesives layer D and is on the opposite side at least partly joined to the photopolymer layer B.

5. The layer construction according to claim 4, wherein the layer construction further contains a substrate layer E, wherein the adhesives layer D is on one side at least partly joined to the substrate layer E and is on the opposite side at least partly joined to the protective layer C.

6. A kit of parts containing at least one areal photopolymer layer and an aqueous composition for generating an at least partly cured protective layer C, wherein the aqueous composition comprises
   (I) at least one polyvinyl alcohol,
   (II) at least one crosslinker for polyvinyl alcohols,
   (III) optionally at least one adhesion promoter, wherein the adhesion promoter is preferably, at least one hydrolyzate of an aminoalkyl trialkoxysilane and
   (IV) optionally at least one surfactant and
   wherein the photopolymer layer is optionally disposed atop a substrate layer A.

7. The kit of parts according to claim 6, further containing an adhesives layer D and a substrate layer E.

8. A process for producing the layer construction according to claim 1, wherein initially an at least partly cured protective layer C is applied atop a photopolymer layer B, wherein the photopolymer layer B is optionally disposed atop a substrate layer A, to afford a layer composite B-C or A-B-C, wherein the protective layer is obtainable by reaction of an aqueous composition comprising
   (I) at least one polyvinyl alcohol,
   (II) at least one crosslinker for polyvinyl alcohols,
   (III) optionally at least one adhesion promoter, wherein the adhesion promoter is preferably at least one hydrolyzate of an aminoalkyl trialkoxysilane and
   (IV) optionally at least one surfactant.

9. The process according to claim 8, wherein in a further subsequent step an adhesives layer D is applied atop the at least partly cured protective layer C to afford a layer composite B-C-D or A-B-C-D and thereafter in a further subsequent step a substrate layer E is applied atop the adhesives layer D to afford a layer composite B-C-D-E or A-B-C-D-E.

10. The process according to claim 8, wherein a hologram is photoinscribed and fixed into the layer composite B-C, A-B-C, B-C-D, A-B-C-D, B-C-D-E or A-B-C-D-E.

11. The layer construction according to claim 1, process according to claim 8 or kit of parts according to claim 6, wherein the at least one polyvinyl alcohol according to DIN 53015:2001-02 as a 4% by weight solution in water at 20° C. has a viscosity of ≥25 mPa*s, and wherein the polyvinyl alcohol preferably according to DIN EN ISO 3681:2007-10-01 has a degree of hydrolysis of ≥85 mol %.

12. The layer construction according to claim 1, process according to claim 8 or kit of parts according to claim 6, wherein the crosslinker for polyvinyl alcohols is selected from the group consisting of aqueous glyoxal solution, glutaraldehyde, oxalic acid, N,N'-dimethylurea, magnesium hydroxide, calcium hydroxide, boric acid, borate salts, aluminates, aluminum sulfate, silicic acid, silicic esters and/or combinations of at least two of these.

13. A method comprising utilizing the kit of parts according to claim 6 for producing a layer construction, wherein initially an at least partly cured protective layer C is applied atop a photopolymer layer B, wherein the photopolymer layer B is optionally disposed atop a substrate layer A, to afford a layer composite B-C or A-B-C, wherein the protective layer is obtainable by reaction of an aqueous composition comprising
  (I) at least one polyvinyl alcohol,
  (II) at least one crosslinker for polyvinyl alcohols,
  (III) optionally at least one adhesion promoter, wherein the adhesion promoter is preferably at least one hydrolyzate of an aminoalkyl trialkoxysilane and
optionally at least one surfactant.

14. A method comprising utilizing of an at least partly cured protective layer C for protection of a photopolymer layer B, wherein the protective layer C is obtainable by reaction of an aqueous composition comprising
  (I) at least one polyvinyl alcohol,
  (II) at least one crosslinker for polyvinyl alcohols,
  (III) optionally at least one adhesion promoter, wherein the adhesion promoter is preferably, at least one hydrolyzate of an aminoalkyl trialkoxysilane and
  (IV) optionally at least one surfactant.

15. A method comprising utilizing the layer construction according to claim 1 as a holographic recording medium.

16. An optical display comprising a layer construction containing a hologram according to claim 1, wherein the optical display is selected from the group consisting of autostereoscopic and/or holographic displays, projection screens, displays with switchable restricted emission characteristics for privacy filters and bidirectional multiuser screens, virtual displays, head-up displays, head-mounted displays, illumination symbols, warning lamps, signal lamps, floodlights/headlights and display panels.

17. A security document comprising a layer construction containing a hologram according to claim 1.

* * * * *